(12) United States Patent
Shida et al.

(10) Patent No.: US 7,353,596 B2
(45) Date of Patent: Apr. 8, 2008

(54) COMPONENT MOUNTING METHOD

(75) Inventors: Satoshi Shida, Hirakata (JP); Shinji Kanayama, Kashihara (JP); Shunji Onobori, Kyoto (JP); Shuichi Hirata, Osaka (JP); Mamoru Nakao, Moriguchi (JP); Kunio Oe, Hirakata (JP); Akira Kugihara, Katano (JP); Shoriki Narita, Hirakata (JP); Yoshitaka Etoh, Katano (JP); Hiroshi Haji, Chikushino (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 204 days.

(21) Appl. No.: 10/549,175

(22) PCT Filed: Mar. 18, 2004

(86) PCT No.: PCT/JP2004/003620

§ 371 (c)(1),
(2), (4) Date: Sep. 16, 2005

(87) PCT Pub. No.: WO2004/084293

PCT Pub. Date: Sep. 30, 2004

(65) Prior Publication Data

US 2006/0185157 A1 Aug. 24, 2006

(30) Foreign Application Priority Data

Mar. 20, 2003 (JP) ............................. 2003-077637

(51) Int. Cl.
*H01R 9/00* (2006.01)
*H05K 3/00* (2006.01)

(52) U.S. Cl. ...................... 29/844; 29/832; 228/180.22

(58) Field of Classification Search ................. 29/739, 29/740, 832–834, 836, 840, 843; 156/578; 228/36, 38, 40, 41, 180.1, 180.22, 223
See application file for complete search history.

(56) References Cited

U.S. PATENT DOCUMENTS

| | | | | |
|---|---|---|---|---|
| 4,951,388 | A | * | 8/1990 | Eguchi et al. ............... 29/832 |
| 5,397,423 | A | * | 3/1995 | Bantz et al. .................. 29/742 |
| 5,839,187 | A | * | 11/1998 | Sato et al. .................... 29/743 |
| 2004/0003891 | A1 | * | 1/2004 | Cheng et al. ............... 156/578 |

FOREIGN PATENT DOCUMENTS

| | | |
|---|---|---|
| JP | 9-082748 | 3/1997 |
| JP | 10-150075 | 6/1998 |
| JP | 10-209208 | 8/1998 |
| JP | 11-135572 | 5/1999 |
| JP | 2000-012717 | 1/2000 |
| JP | 2000-022394 | 1/2000 |

* cited by examiner

*Primary Examiner*—Donghai D. Nguyen
(74) *Attorney, Agent, or Firm*—Wenderoth, Lind & Ponack, L.L.P.

(57) ABSTRACT

In component mounting process for a plurality of components to be mounted onto a board, a plurality of bump electrode portions formed on mounting-side surfaces of the components to be mounted onto the board are brought into contact with a bonding-assistant agent so that the bonding-assistant agent is supplied thereto to allow the bonding-assistant agent-supplied components to be mounted onto the board. The component mounting process includes supplying the bonding-assistant agent to a first component among the plurality of components, and starting the supply of the bonding-assistant agent to a second component among the plurality of components before completion of the mounting of the bonding-assistant agent-supplied first component onto the board.

4 Claims, 27 Drawing Sheets

COMPONENT MOUNTING METHOD

BACKGROUND OF THE INVENTION

The present invention relates to a component mounting apparatus and a component mounting method for mounting a plurality of components onto a circuit board, in which device or method a bonding-assistant agent is supplied to the components by making a plurality of bump electrodes brought into contact with the bonding-assistant agent, the bump electrodes being formed on mounting-side surfaces of the components on which side the components are to be mounted onto the board, and the bonding-assistant agent serving as an auxiliary agent for bonding in the mounting of the components onto the board, where the components supplied with the bonding-assistant agent are mounted onto the circuit board via the respective bump electrodes.

Conventionally, as this kind of component mounting apparatus and component mounting method, those of various structures have been known (see, e.g., Japanese unexamined patent publication No. H09-82748). As an example of such conventional component mounting apparatuses, a component mounting apparatus 501 is shown in FIG. 22, which is a perspective view of its appearance, and in FIG. 23, which is a schematic perspective view schematically showing only main structural part of the component mounting apparatus 501.

As shown in FIGS. 22 and 23, the component mounting apparatus 501 is a component mounting apparatus which performs the mounting of a bare IC chip or other component 503 onto a board 502, and which has, on its base 560, a mounting head unit 510 for holding and mounting the component 503 onto the board 502, a board holding unit 550 for releasably holding the board 502, a component feed unit 540 for extractably housing a plurality of components 503, and a transfer unit 520 for extracting a feed-object component 503 from the component feed unit 540 and transferring the component 503 to the mounting head unit 510. The component mounting apparatus 501 further includes a board conveyance unit 580 for feeding the board 502, onto which the component 503 is to be mounted; to the board holding unit 550 and for extracting the board 502, on which the components 503 have been mounted, from the board holding unit 550 and discharging the board 502 from the component mounting apparatus 501.

The structure of the component mounting apparatus 501 is described in more detail with reference to FIG. 23. The component feed unit 540 is enabled to feed a plurality of components 503, which are formed by dicing of a wafer 504, while keeping them arrayed and positioned on its top surface. Also, as shown in FIG. 22, a component housing section 570 for housing a plurality of wafers 504 or the like so that the wafer 504 or the like can be fed to the component feed unit 540 is provided in front of the component feed unit 540 as viewed in the figure.

Further, as shown in FIG. 23, the board holding unit 550 includes an X-Y table 551 for moving the held board 502 in an X-axis direction or a Y-axis direction in the figure. The mounting head unit 510 includes a mounting head section 511 for releasably sucking and holding the component 503 at its lower end and performing mounting operation of the sucked and held component 503 to the board 502, and a mounting head moving unit 512 for supporting the mounting head section 511 and moving forward and backward the mounting head section 511 along the X-axis direction in the figure. The mounting head unit 510 further includes an image pickup camera 513 for capturing an image of a sucking-and-holding state of the component 503 sucked and held by the mounting head section 511 to thereby recognize the sucking-and-holding posture.

As shown in FIG. 23, the transfer unit 520 includes an inversion head section 521 which sucks and holds and extracts one component 503 out of the components 503 extractably positioned on the component feed unit 540 and which turns 180 degree about a rotational center placed along the Y-axis direction in the figure to invert upper and lower faces of the component 503, and an inversion head moving unit 522 which moves the inversion head section 521 forward and backward along the X-axis direction in the figure between a position above the component feed unit 540 and a delivery position to the mounting head section 511. Further, on the right side in the X-axis direction of the board holding unit 550 on the base 560 is provided a flux supply unit which supplies flux, which is an example of the bonding-assistant agent, to the component 503.

A schematic explanatory view for schematically explaining mounting operation of the component 503 to the board 502 in the component mounting apparatus 501 having the structure shown above is shown in FIG. 24. The mounting operation is described below with reference to FIG. 24.

As shown in FIG. 24, the component feed unit 540 has a plurality of components 503 placed thereon with an upper face of each component 503 serving as a mounting-side surface 503a for mounting to the board 502, where a plurality of bump electrode portions 503b are formed on the mounting-side surface 503a.

The inversion head section 521 is moved to above the component feed unit 540 (assumed to be a component feed region J), where the mounting-side surface 503a of the component 503 is sucked and held by the inversion head section 521, and the component 503 is extracted from the component feed unit 540. Thereafter, the inversion head section 521 is moved by the inversion head moving unit 522 from above the component feed unit 540 up to a component delivery position L for the component 503 to be delivered to the mounting head section 511. During this move process, the inversion head section 521 is inverted to make an inversion of the component 503 so that its mounting-side surface 503a of the sucked-and-held component 503 is made to face downward.

Next, the mounting head section 511 is placed at the component delivery position L, and further the mounting head section 511 is moved down to suck and hold the component 503 sucked and held by the inversion head section 521. Moreover, the sucking and holding of the component 503 by the inversion head section 521 is released to make delivery of the component 503.

After the delivery, the mounting head section 511 is moved from the component delivery position L up to a flux supply position M, which is a position above a flux supply unit 530. The flux supply unit 530 has on its top a flux containing section 531 in which flux is contained. As a result of move-down of the component 503 sucked and held by the mounting head section 511, the individual bump electrode portions 503b formed on the mounting-side surface 503a of the component 503 are brought into contact with the flux contained in the flux containing section 531, by which flux supply to the individual bump electrode portions 503b is performed. It is noted that this flux supply is performed in a state that the component 503 is sucked and held by the mounting head section 511, and effected by retention of contact with the flux for a specified time duration, e.g., 2 seconds.

Upon completion of the flux supply, the mounting head section 511 is moved up and further moved to a component mounting region K, which is above the board 502 held by the board holding unit 550. After this move, image capture by the image pickup camera 513 is performed, so that the sucking-and-holding posture of the component 503 is recognized.

Thereafter, alignment between the mounting position of the component 503 on the board 502 and the component 503 sucked and held by the mounting head section 511 is performed by the X-Y table 551. Subsequent to this alignment, the mounting head section 511 is moved down, and the component 503, to which flux has been supplied, is mounted onto the board 502.

The mounting head section 511, which has executed the mounting operation, is moved to the component delivery position L to receive the next component 503 sucked and held by the inversion head section 521.

SUMMARY OF THE INVENTION

However, with the component mounting apparatus 501 of the structure described above, since the time required for the mounting head section 511, which has the component 503 delivered from the inversion head section 521 at the component delivery position L, to mount the component 503 onto the board 502 includes the time required for the flux supply to the component 503, there is an issue that the time required for the flux supply causes an obstacle to reduction in the time required for component mounting.

Therefore, it could be conceived to contrive the placement of the flux supply unit 530 on the base 560 so that the flux supply unit is placed, for example, between the component delivery position L and the component mounting region K so as to shorten the move distance of the mounting head section 511 to reduce the time required for component mounting. However, since the duration of contact with flux for a specified time is indispensable for the flux supply, it is impossible to reduce the time itself required for flux supply. Thus, such techniques cannot essentially solve the above issue.

Accordingly, an object of the present invention is to provide, for solving the above-described issues, a component mounting apparatus and a component mounting method for mounting a plurality of components onto a circuit board, in which device or method a bonding-assistant agent is supplied to the components by making a plurality of bump electrodes brought into contact with the bonding-assistant agent, the bump electrodes being formed on mounting-side surfaces of the components on which side the components are to be mounted onto the board, and the bonding-assistant agent serving as an auxiliary agent for bonding in the mounting of the components onto the board, and in which device or method the components supplied with the bonding-assistant agent are mounted onto the board, where in this component mounting, the effect of the time required for the supply of the bonding-assistant agent on the time required for component mounting is reduced so that efficient component mounting can be fulfilled.

In order to achieve the above object, the present invention has the following constitutions.

According to a first aspect of the present invention, there is provided a component mounting apparatus comprising:

a component feed unit in which a plurality of components are feedably placed;

a board holding unit for holding a board on which the components are to be mounted;

a bonding-assistant agent supply unit which contains a bonding-assistant agent serving as an auxiliary agent for bonding by heating between a plurality of bump electrode portions and the board in a contact state thereof, the bump electrode portions being formed on mounting-side surfaces of the components to be mounted onto the board, and which supplies the bonding-assistant agent to the bump electrode portions by bringing the bonding-assistant agent into contact with the individual bump electrode portions;

a transfer unit for holding and extracting the component placed in the component feed unit and transferring the component to the bonding-assistant agent supply unit so that the bonding-assistant agent is supplied to the individual bump electrode portions; and a mounting head unit for holding and extracting the component, which has been supplied with the bonding-assistant agent, from the bonding-assistant agent supply unit and mounting the component onto the board held by the board holding unit via the individual bump electrode portions, wherein the bonding-assistant agent supply unit comprises:

a bonding-assistant agent containing section in which the component is placed and which contains the bonding-assistant agent so that the supply of the bonding-assistant agent through the contact by placing the component; and a containing-section moving unit for reciprocatively moving the bonding-assistant agent containing section between a transfer position, at which the component is transferred to the bonding-assistant agent supply unit by the transfer unit, and an extraction position, at which the component supplied with the bonding-assistant agent is extracted from the bonding-assistant agent supply unit by the mounting head unit, and wherein during a process of the move of the bonding-assistant agent containing section from the transfer position to the extraction position by the containing-section moving unit, the supply of the bonding-assistant agent to the component placed in the bonding-assistant agent containing section is performed.

According to a second aspect of the present invention, there is provided the component mounting apparatus as defined in the first aspect, wherein the containing-section moving unit performs the move of the bonding-assistant agent containing section together with the components so that the component, which has been released from the holding by the transfer unit and placed in the bonding-assistant agent containing section at the transfer position of the bonding-assistant agent containing section, is held and extracted by the mounting head unit at the extraction position.

According to a third aspect of the present invention, there is provided the component mounting apparatus as defined in the first aspect, wherein the transfer unit includes an inversion head section for holding and extracting the component positioned in the component feed unit with the mounting-side surface facing upward and inverting the held component so that the mounting-side surface faces downward.

According to a fourth aspect of the present invention, there is provided the component mounting apparatus as defined in the third aspect, wherein the transfer unit further includes a transfer head section for holding and receiving the component held in the inverted state by the inversion head section and transferring the held component to the bonding-assistant agent supply unit.

According to a fifth aspect of the present invention, there is provided the component mounting apparatus as defined in the third aspect or the fourth aspect, wherein the transfer unit comprises an inversion-head-section moving unit for reciprocatively moving the inversion head section between a position above the component feed unit and the transfer position for the bonding-assistant agent supply unit, the mounting head unit comprises:

a mounting head section for releasably holding the component and mounting the held component onto the board; and a mounting-head-section moving unit for reciprocatively moving the mounting head section between the extraction position to which the component is extracted from the bonding-assistant agent supply unit and a position above the board holding unit, and wherein the moving operation of the inversion head section by the inversion-head-section moving unit, and the moving operation of the mounting head section by the mounting-head-section moving unit, is executed separately and independently of the moving operation of the bonding-assistant agent containing section by the containing-section moving unit.

According to a sixth aspect of the present invention, there is provided the component mounting apparatus as defined in the first aspect, wherein the bonding-assistant agent supply unit further comprises a uniform-thickness-layer formation processing section for performing an uniform-thickness-layer formation process for the bonding-assistant agent contained in the bonding-assistant agent containing section, wherein while the containing-section moving unit transfers the bonding-assistant agent containing section from the extraction position to the transfer position, the uniform-thickness-layer formation process by the uniform-thickness-layer formation processing section is carried out.

According to a seventh aspect of the present invention, there is provided the component mounting apparatus as defined in the first aspect, wherein the bonding-assistant agent is flux.

According to an eighth aspect of the present invention, there is provided a component mounting method in which a plurality of bump electrode portions formed on mounting-side surfaces of components to be mounted onto a board are brought into contact with a bonding-assistant agent, which is contained in a bonding-assistant agent containing section and served as an assistant for bonding between the bump electrode portions and the board by heating in a contact state thereof, so that the bonding-assistant agent is supplied to the individual bump electrode portions, and then the components are bonded and mounted to the board via the bump electrode portions supplied with the bonding-assistant agent, the method comprising:

supplying the bonding-assistant agent to a first component among the plurality of components; and starting the supply of the bonding-assistant agent to a second component among the plurality of components before completion of the mounting of the first component, which is supplied with the bonding-assistant agent, onto the board.

According to a ninth aspect of the present invention, there is provided the component mounting method as defined in the eighth aspect, wherein the supply of the bonding-assistant agent is executed during a move process that the component placed in the bonding-assistant agent containing section is moved from a transfer position, where the component is to be transferred to the bonding-assistant agent containing section, and an extraction position, where the component supplied with the bonding-assistant agent is extracted for the mounting from the bonding-assistant agent containing section.

According to a tenth aspect of the present invention, there is provided the component mounting method as defined in the ninth aspect, wherein the supply of the bonding-assistant agent to the component is completed at a time when the bonding-assistant agent containing section in which the component is placed has reached the extraction position.

According to an eleventh aspect of the present invention, there is provided the component mounting method as defined in the tenth aspect, further comprising:

holding and extracting the first component from a component feed unit in which the plurality of components are extractably placed, and then transferring the first component to the bonding-assistant agent containing section; and starting the holding and extracting of the second component from the component feed unit, before completion of the supply of the bonding-assistant agent to the first component.

According to the first aspect of the present invention, since the transfer unit for transferring the component supplied from the component feed unit to the bonding-assistant agent containing section of the bonding-assistant agent supply unit, and the mounting head unit for extracting from the bonding-assistant agent containing section the component placed in the bonding-assistant agent containing section and supplied with the bonding-assistant agent, are provided separately and independently of each other in the component mounting apparatus, it is practicable to perform the transfer operation of the component to the bonding-assistant agent containing section for the supply of the bonding-assistant agent, and the extraction and subsequent mounting operation of the bonding-assistant agent-supplied component from the bonding-assistant agent containing section and onto the board, in parallel to each other. Therefore, the effect of the time required for the supply of the bonding-assistant agent to the component on the time required for component mounting can be reduced, so that the time required for component mounting can be shortened. Thus, it becomes practicable to fulfill efficient, higher-speed component mounting.

Also, by virtue of the arrangement that the containing-section moving unit for reciprocatively moving the bonding-assistant agent containing section between the transfer position toward the bonding-assistant agent supply unit and the extraction position from the bonding-assistant agent supply unit is provided in the bonding-assistant agent supply unit, the supply of the bonding-assistant agent to the set component is performed during the process of the move from the transfer position to the extraction position, while the component is moved along with the bonding-assistant agent containing section to a neighborhood of the board held by the board holding unit, thus making it possible to shorten the move length of the mounting head unit for the extraction of the component at the extraction position. Thus, the time required for component mounting can be shortened.

Further, in supply of the bonding-assistant agent which is performed by placing the component in the bonding-assistant agent containing section and bringing the individual bump electrode portions and the bonding-assistant agent into contact with each other, the contact needs to be securely held for a specified time in order to fulfill stable bonding-assistant agent supply to the individual bump electrode portions, whereas this specified time to be secured can be utilized for the move of the component to the extraction position. Accordingly, the supply operation of the bonding-assistant agent and the mounting operation of the component can be carried out in parallel, and moreover the time required for component mounting can be shortened, so that efficient, higher-speed component mounting can be fulfilled.

According to the second aspect of the invention, the component is transferred at the transfer position to the bonding-assistant agent containing section by the transfer unit, the transferred and set component is moved to the extraction position, and then the component is extracted by the mounting head unit. Therefore, the operation by the transfer unit, the operation by the mounting head unit, and the move operation of the component by the containing section moving unit can be carried out independently of one another, and the individual operations can be carried out in parallel. Thus, efficient component mounting can be fulfilled.

According to the third or fourth aspect of the invention, even in cases where the transfer unit includes the inversion head section or the transfer head section, the effects by the individual aspects can be obtained.

According to the fifth aspect of the invention, since the inversion-head-section moving unit for performing the mounting operation of the inversion head section, the mounting-head-section moving unit for performing the mounting operation of the mounting head section, and containing-section moving unit are enabled to perform their respective mounting operations separately and independently of one another, those mounting operations can be carried out in parallel, so that efficient component mounting can be fulfilled.

According to the sixth aspect of the invention, the uniform-thickness-layer formation process for the bonding-assistant agent by the uniform-thickness-layer formation processing section is carried out during the move process of the bonding-assistant agent containing section from the extraction position to the transfer position by the containing-section moving unit. Therefore, continuous, stable supply operation of the bonding-assistant agent to the component can be fulfilled. Further, since such an operation is carried out during the move process of the bonding-assistant agent containing section from the extraction position to the transfer position, efficient component mounting can be achieved without any influence given on the time required for component mounting.

According to the seventh aspect of the invention, since the bonding-assistant agent is flux, the effects by the individual aspects can be obtained.

According to the eighth aspect of the invention, after the supply of the bonding-assistant agent to the first component among the plurality of components is performed, and before the mounting of the bonding-assistant agent-supplied first component onto the board is completed, the supply of the bonding-assistant agent to the second component among the plurality of components is started. By virtue of this, the mounting operation of the first component onto the board, and the supply operation of the bonding-assistant agent to the second component to be next mounted onto the board, can be carried out in parallel to each other. Accordingly, whereas the conventional component mounting method has had an issue that the supply operation of the bonding-assistant agent to the second component cannot be performed during the mounting operation of the first component so that the time required for supply operation of the bonding-assistant agent has been an obstacle to reduction in the time required for component mounting operation, it becomes practicable to solve this issue. Therefore, the effect of the time required for the supply of the bonding-assistant agent on the time required for component mounting can be reduced, and efficient component mounting can be fulfilled.

According to the ninth aspect of the invention, the supply operation of the bonding-assistant agent to the component can be carried out in parallel with the move operation of the bonding-assistant agent containing section in which the component is set. Thus, more efficient component mounting can be fulfilled.

According to the tenth or eleventh aspect of the invention, before the supply of the bonding-assistant agent to the first component is completed upon the arrival at the extraction position, the extraction of the second component from the component feed unit is started. Accordingly, the individual operations can be carried out in parallel, so that the time required for component mounting of a plurality of components can be reduced. Thus, efficient component mounting can be fulfilled.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
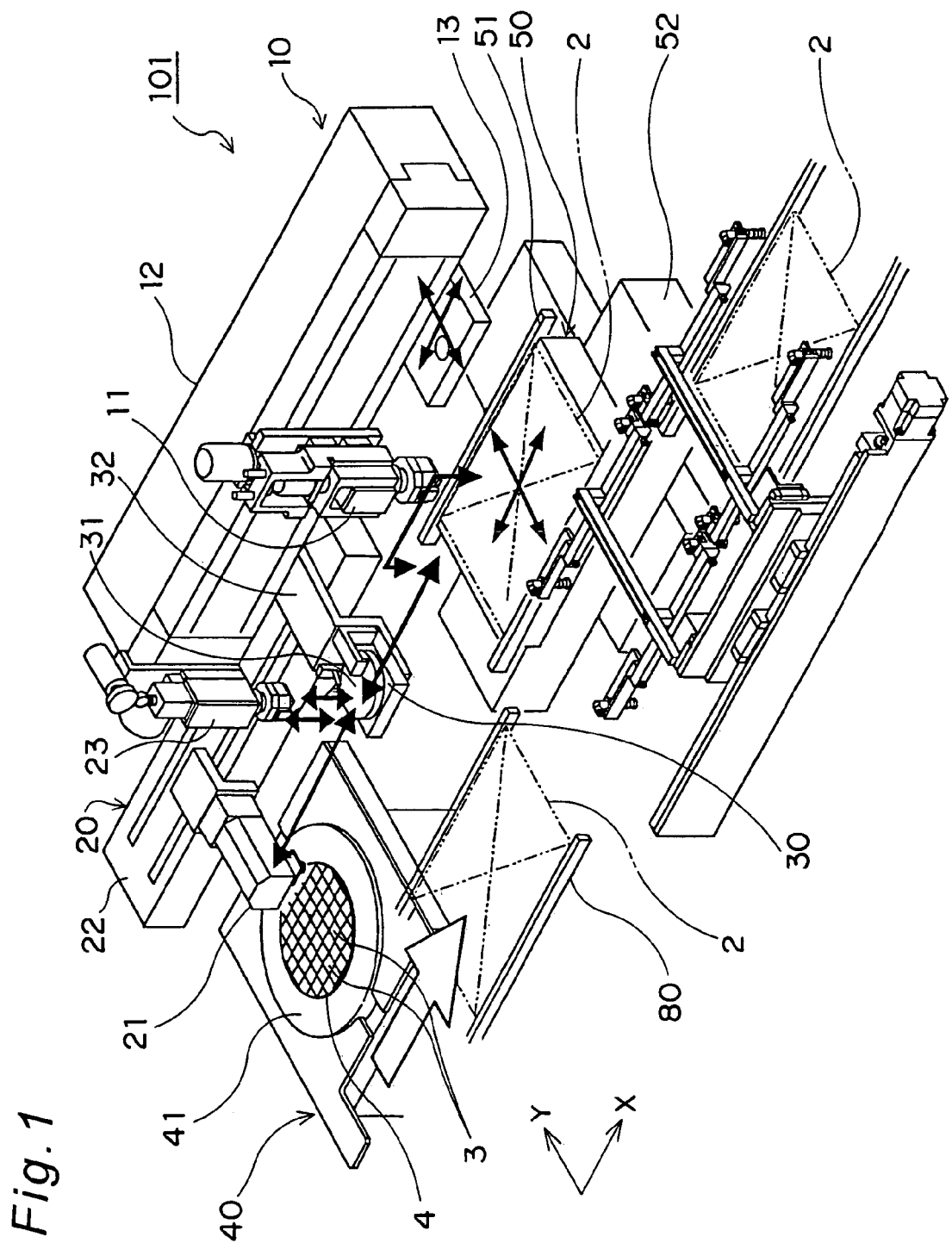
FIG. 1 is a schematic perspective view showing the structure of a component mounting apparatus according to an embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

A schematic perspective view showing main constituent members of a component mounting apparatus 101 which is an example of the component mounting apparatus according to an embodiment of the invention is shown in FIG. 1.

As shown in FIG. 1, the component mounting apparatus 101 is a component mounting apparatus for mounting, for example, a bare IC chip or other like component 3 onto a board 2, the component mounting apparatus including a mounting head unit 10 for holding and mounting the component 3 onto the board 2, a board holding unit 50 for releasably holding the board 2, a component feed unit 40 for extractably housing a plurality of components 3, and a transfer unit 20 for extracting a feed-object component 3 from the component feed unit 40 and transferring the component 3 to the mounting head unit 10. The component mounting apparatus 101 further includes a board conveyance unit 80 for conveying and feeding the board 2, onto which the component 3 fed to the component mounting apparatus 101 is to be mounted, to the board holding unit 50 and for extracting the board 2, on which the components 3 have been mounted, from the board holding unit 50 and discharging the board 2 from the component mounting apparatus 101.

As shown in FIG. 1, the component feed unit 40 has a component placement base 41 on which a plurality of components 3 (e.g., bare IC chips) formed by dicing of a wafer 4 are to be extractably arrayed and positioned on its top surface. In addition, an unshown push-up unit for pushing up, from below, one component 3 selected from among the aligned and arrayed components 3 is provided so that the component 3 can be put into an extractable state by the push-up.

Also, as shown in FIG. 1, the board holding unit 50 includes a stage 51 for releasably holding the board 2, and an X-Y table 52 which is an example of a board moving unit for moving the stage 51 in an X-axis direction or a Y-axis direction in the figure. It is noted that, in FIG. 1, the X-axis direction and the Y-axis direction are generally parallel to the surface of the board 2 and perpendicular to each other.

Also, as shown in FIG. 1, the mounting head unit 10 includes a mounting head section 11 which is capable of releasably sucking and holding the component 3 at its lower end and which performs a mounting operation of the sucked and held component 3 to the board 2 by its up/down operation, and a mounting-head-section moving unit 12 which supports the mounting head section 11 and moves forward and backward the mounting head section 11 along the X-axis direction in the figure. The mounting head unit 10 further includes an image pickup camera 13 which is an example of an image pickup unit for capturing, from a lower-face side of the component 3, an image of a sucking-and-holding state of the component 3 sucked and held by the mounting head section 11 to thereby recognize the sucking-and-holding posture. The image pickup camera 13 has a moving unit (not shown) and can be moved by the moving unit between the board 2 and the mounting head section 11 so as to be capable of capturing an image of the component 3 sucked and held by the mounting head section 11 placed above the board 2. The image pickup camera 13, upon completion of the image pickup, can also be moved by the moving unit to a withdrawal position where interference with the mounting head section 11 can be avoided.

As shown in FIG. 1, the transfer unit 20 includes an inversion head section 21 which sucks and holds and releasably extracts one component 3 out of the components 3 extractably positioned on the component placement base 41 in the component feed unit 40. The inversion head section 21 has an inversion unit (not shown) which makes the inversion head section 21 itself inverted about a rotational center placed along the Y-axis direction in the figure so that upper and lower faces of the sucked and held component 3 are inverted by about 180 degree. It is noted that the inversion head section 21 is enabled to move up and down. Further, the transfer unit 20 includes a transfer head section 23 for sucking and holding the component 3, which has been sucked and held and inverted by the inversion head section 21, to receive the component 3 from the inversion head section 21. Also, the transfer unit 20 has an inversion-head-section moving unit 22 for moving forward and backward the inversion head section 21 along the X-axis direction in the figure. The inversion-head-section moving unit 22 is enabled to reciprocate the inversion head section 21 between above the component feed unit 40, which is located at the left end of the movement range along the X-axis direction as viewed in the figure, and below the transfer head section 23, which is located at the right end in the figure. It is noted that the transfer head section 23, although enabled to move up and down, is not moved, or fixed, along the X-axis direction or the Y-axis direction in the figure.

Also, although not shown in detail in FIG. 1, each of the components 3 fed from the component feed unit 40 has a plurality of bump electrode portions preliminarily formed on its mounting-side surface for mounting to the board 2 so that the components 3 are mounted onto board electrodes formed at component mounting positions, respectively, on the board 2 via those bump electrode portions. These bump electrode portions are bonding metal bumps or the like formed of solder or other bonding material (bonding metal). The bump electrode portions are eventually heated and melted as kept in contact with the board electrodes, respectively, and then cooled and solidified, by which the bonding to the board 2 via the respective bump electrode portions is retained, thus achieving the mounting of the individual components 3. In order to obtain a successful molten state of the respective bump electrode portions during this heating and melting process, or to obtain a successful molten state of solder or the like to be bonded to the respective bump electrode portions in the case where the bonding material is preliminarily supplied onto the board electrodes on the board 2, flux supply to the respective bump electrode portions is executed prior to the mounting, the flux being an example of the bonding-assistant agent serving to assist the bonding for the mounting by assisting the melting of the bonding material. As shown in FIG. 1, the component mounting apparatus 101 includes a flux supply unit 30, which is an example of the bonding-assistant agent supply unit for performing such flux supply. The flux supply unit 30 includes a flux containing section 31 that is an example of a bonding-assistant agent containing section which is capable of having the components 3 placed on its top face and which performs flux supply (or flux transfer) by bringing the contained flux into contact with the respective bump electrode portions formed on the mounting-side surface of the component 3 depending on the placement of the components 3, and a containing-section moving unit 32 for moving the flux containing section 31 forward and backward along the X-axis direction in the figure. Further, the containing-section moving unit 32 is enabled to reciprocate the flux containing section 31 between a position below the transfer head section 23, which is the left end position of the move range along the X-axis direction, and a neighborhood position of the stage 51, which is the right end position, as viewed in the figure.

Figure 3:
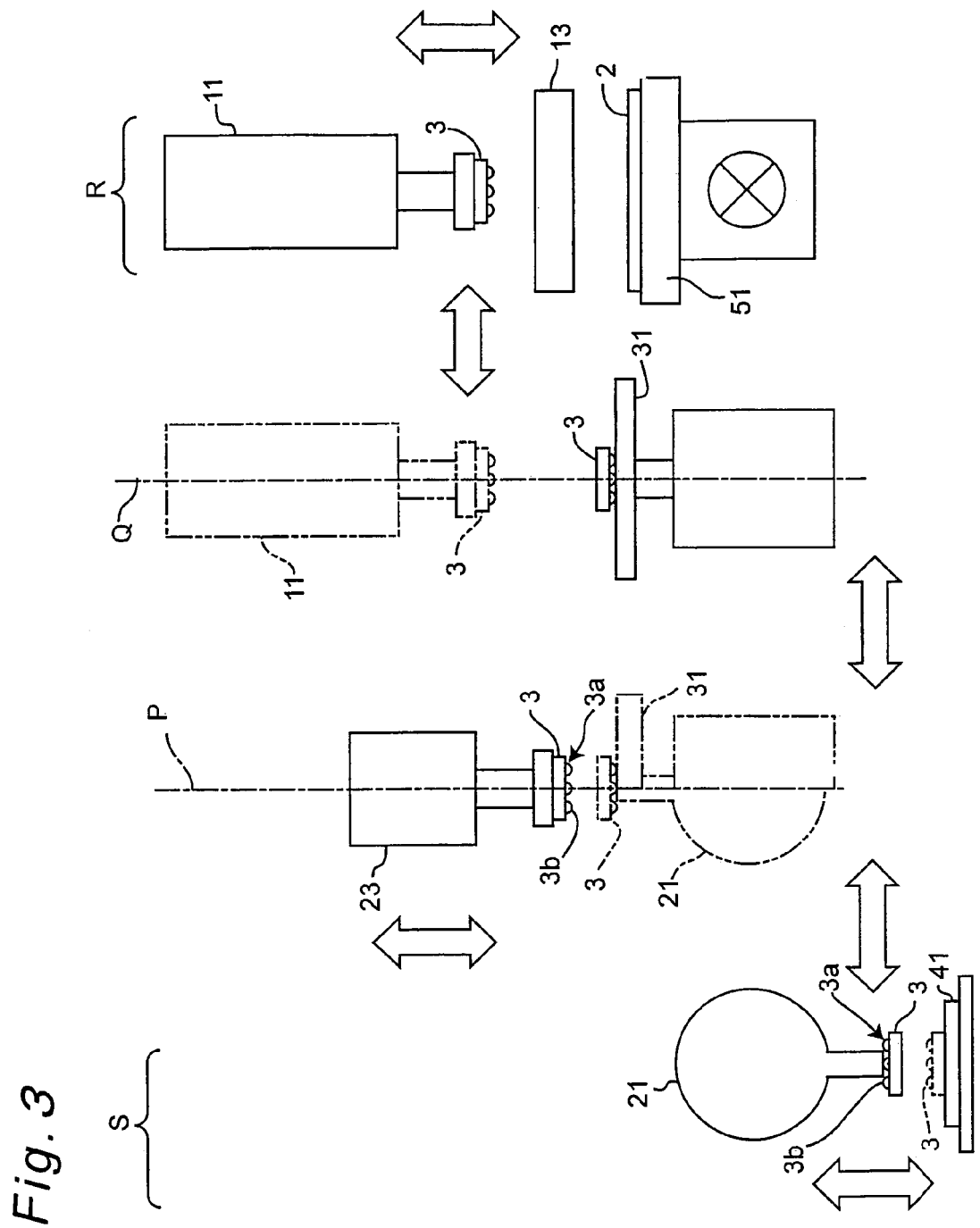
FIG. 3 is a schematic explanatory view showing component mounting operation of the component mounting apparatus of FIG. 1.

Referring now to FIG. 3, which is a schematic explanatory view schematically showing the individual constituent members in the component mounting apparatus 101, the individual positional relations and movable range are explained.

As shown in FIG. 3, on the top face of the component placement base 41 in the component feed unit 40 are placed a plurality of components 3 (however, only one component 3 is shown in FIG. 3) in a state that their mounting-side surfaces 3a each having a plurality of bump electrode portions 3b formed thereon face upward. A region on the component placement base 41 where the components 3 are extractably positioned is assumed to be a component feed region S (an example of the region above the component feed unit). Also, a position where the component 3 is delivered to the transfer head section 23 by the inversion head section 21, and a position where the component 3 sucked and held by the transfer head section 23 is transferred to the flux containing section 31, are coincident with each other by the arrangement that the transfer head section 23 is not moved but fixed in the X-axis and Y-axis directions, the coincident position being assumed to be a transfer or delivery position P for transfer to the flux containing section 31. Further, a position where the component 3 transferred to the flux containing section 31 is delivered to the mounting head section 11 in a neighborhood of the stage 51, i.e., a position where the component 3 is extracted from the flux containing section 31 by the mounting head section 11, is assumed to be an extraction position Q for extraction from the flux containing section 31. Besides, a region above the stage 51 held by the stage 51 is assumed to be a component mounting region R (an example of the region above the board holding unit).

Then, as shown in FIG. 3, the inversion head section 21 is reciprocatably movable between the component feed region S and the transfer position P by the inversion-head-section moving unit 22, while the mounting head section 11 is reciprocatably movable between the extraction position Q and the component mounting region R by the mounting-head-section moving unit 12. Also, the flux containing section 31 is reciprocatably movable between the transfer position P and the extraction position Q by the containing-section moving unit 32. It is noted that these moving units are equipped with driving units for independent move operations, respectively, so that they can perform their respective moves individually and independently. Since those moving units move in the X-axis direction in FIG. 1, their moves cause the component 3 to be moved generally linearly along the X-axis direction, making it possible to fulfill moves of the component 3 in the shortest path. However, instead of such a case, the case may also be that those moving units can move also in the Y-axis direction in the figure to achieve a successful positioning in each of deliveries of the component 3 from the inversion head section 21 to the transfer head section 23, from the transfer head section 23 to the flux containing section 31, and from the flux containing section 31 to the mounting head section 11.

Figure 2:
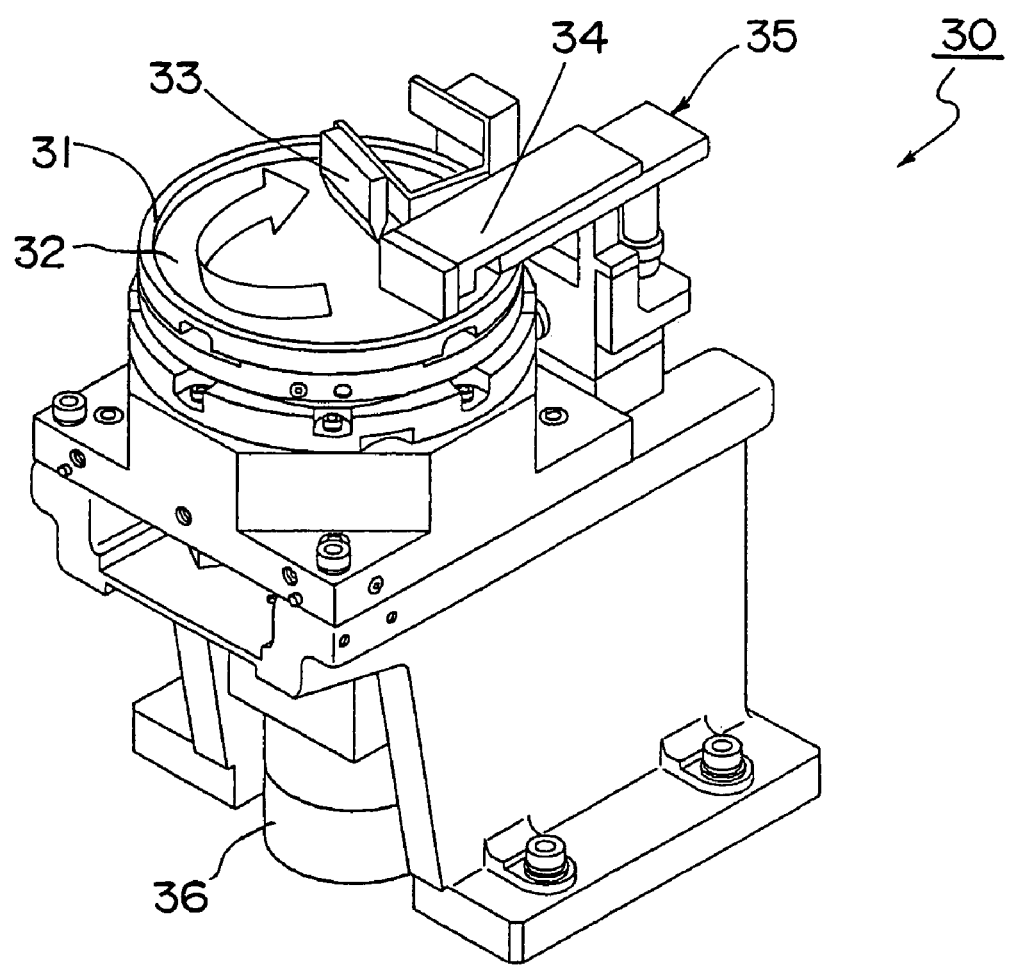
FIG. 2 is a perspective view of a flux supply unit included in the component mounting apparatus of FIG. 1.

Next, referring to FIG. 2, which is a perspective view of the flux supply unit 30, the structure of the flux supply unit 30 is explained in detail.

As shown in FIG. 2, the flux containing section 31 in the flux supply unit 30 is a generally cylindrical-shaped container which is opened in its entire top face and formed with a small height and which has flux contained inside, where a flux layer 32 is formed at the opening-portion top face. The component 3 sucked and held by the transfer head section 23 can be placed on the top face of the flux containing section 31 in such a way that the individual bump electrode portions 3b formed on the mounting-side, i.e. lower-side, surfaces 3a are brought into contact with the flux layer 32. With the individual bump electrode portions 3b of the component 3 kept in contact with the flux layer 32 as shown above, the contact is retained for a specified time, for example, about 1.5-2.0 seconds, by which the supply (i.e., transfer) of flux to the individual bump electrode portions 3b is executed and completed. Hereinafter, this supply (transfer) of flux will be referred to simply as "flux supply."

It is also possible that the move distance of the flux containing section 31 between the transfer position P and the extraction position Q is fixed and the move speed of the flux containing section 31 is determined so that the time required for the aforementioned move of the flux containing section 31 becomes the aforementioned specified contact time. Further, other than such a case, with the move speed of the flux containing section 31 fixed, the distance between the transfer position P and the extraction position Q may be set so that the time required for the aforementioned move of the flux containing section 31 becomes the specified contact time.

In such flux supply, the control of the film thickness of the flux layer 32 is of importance. For example, when the formation height of the bump electrode portions 3b is about 100 μm, the film thickness of the flux layer 32 needs to be set to about 30-50 μm. However, as described above, once flux supply is executed on one component 3, the flux layer 32 has projecting and depressed portions formed thereon due to the contact. For this reason, a uniform-thickness-layer formation processing section 35 is provided as a device for forming (or reproducing) a uniform-thickness-layer by removing the aforementioned projecting and depressed portions. As shown in FIG. 2, the uniform-thickness-layer formation processing section 35 includes a containing-section rotation driving section 36 which rotates the flux containing section 31 about a rotational center placed along its vertical direction to thereby rotate the flux layer 32 about its center, a scraper blade 33 which is in contact with the surface of the flux layer 32 and which levels the flux layer 32 by the aforementioned rotation so as to scrape the projecting and depressed portions formed on the surface of the flux layer 32, and a uniform-thickness-layer forming blade 34 which is in contact with the surface of the flux layer 32 and which uniformizes the film thickness of the flux layer 32 by the aforementioned rotation. It is noted that such uniform-thickness-layer formation process by the rotation of the flux layer 32 can be executed while no components 3 are placed in the flux containing section 31.

The flux containing section 31 needs to be moved with flux contained therein, and during the process of the move, also needs to retain the uniformized flux layer in order to execute the flux supply to the set components 3. From such a point of view, the flux to be contained in the flux containing section 31 is preferably selected as one which has relatively high viscosity so as to be less liable to changes in film thickness due to the move.

Figure 21:
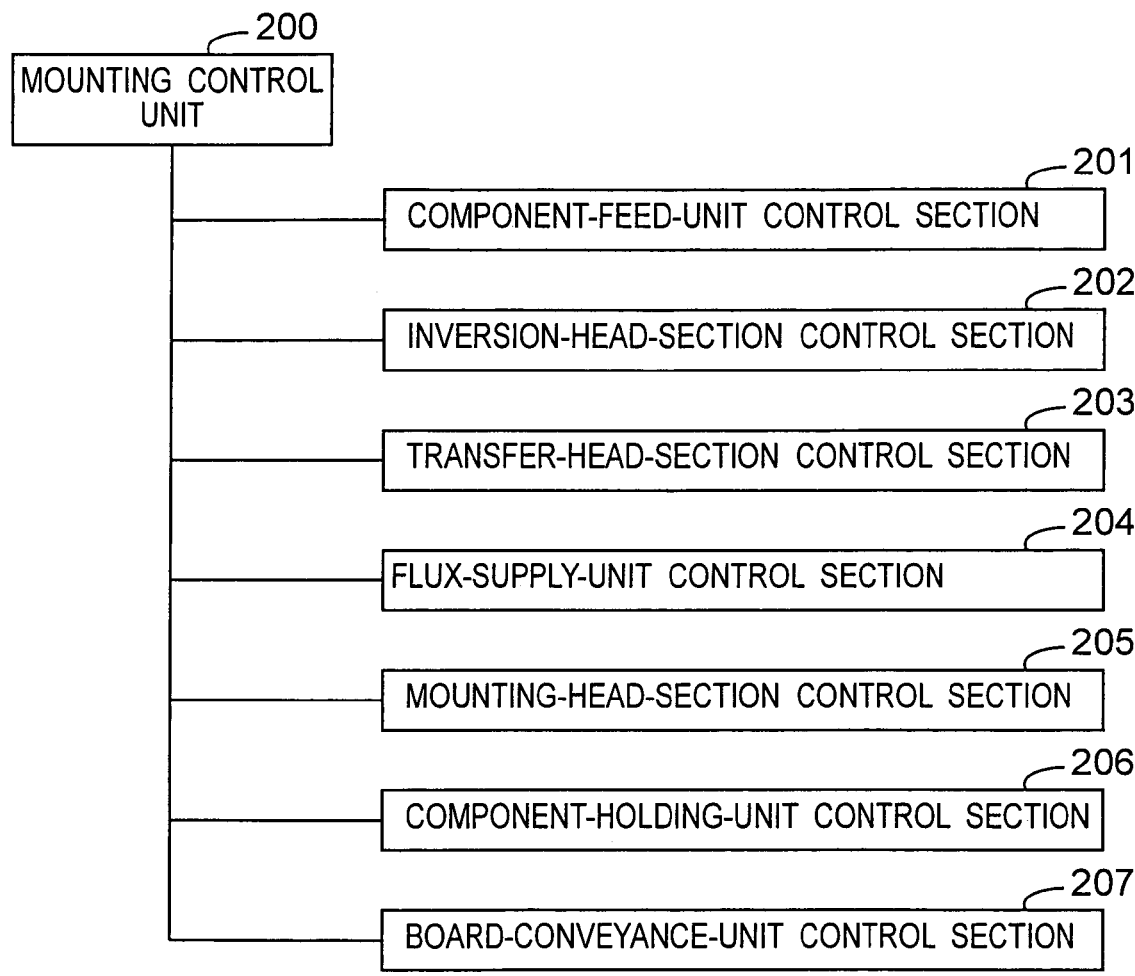
FIG. 21 is a block diagram showing the configuration of a control unit in the component mounting apparatus of FIG. 1.
Figure 22:
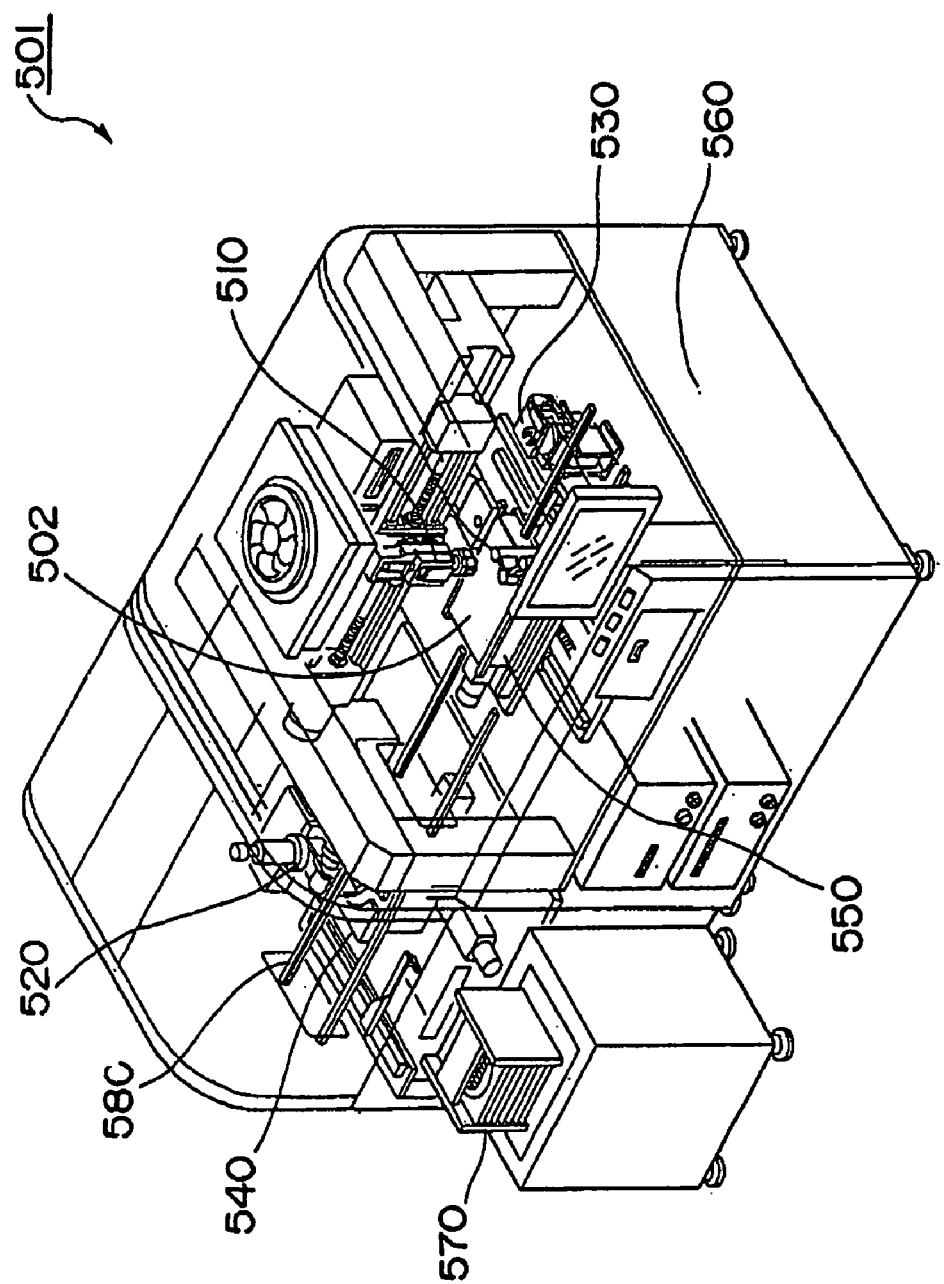
FIG. 22 is a perspective view showing an appearance of a component mounting apparatus according to a prior art.
Figure 23:
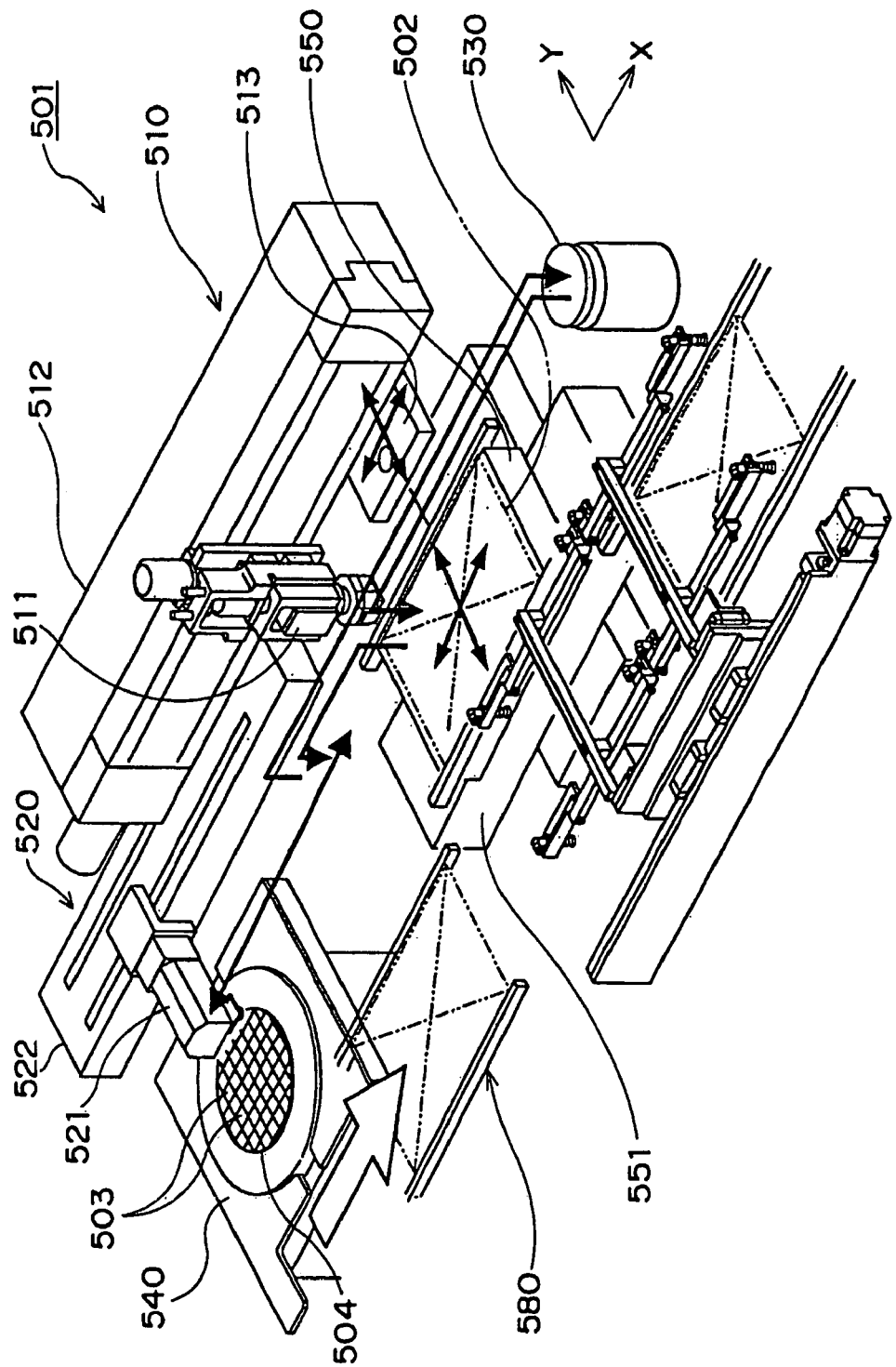
FIG. 23 is a schematic perspective view showing the structure of the prior art component mounting apparatus.
Figure 24:
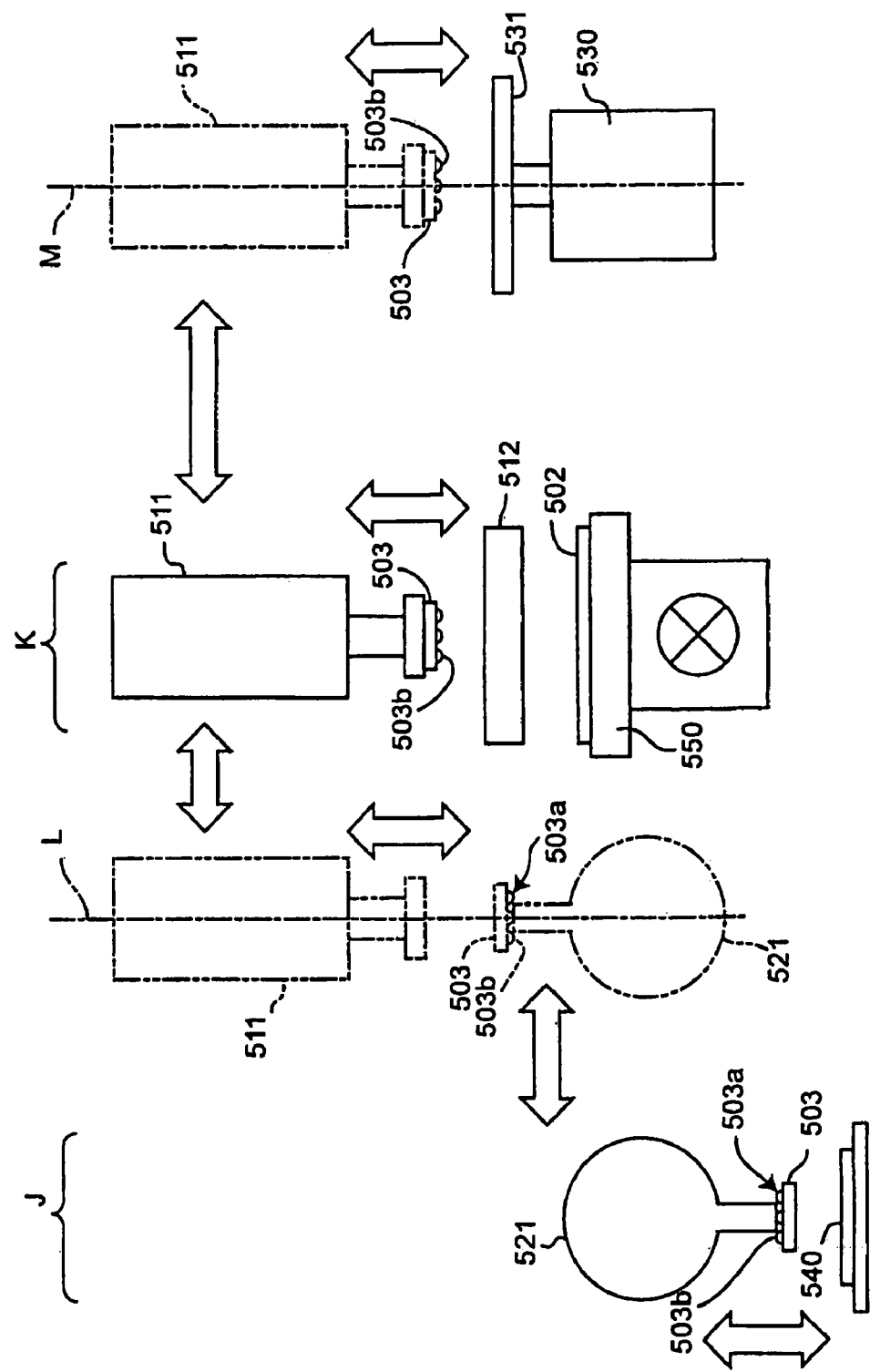
FIG. 24 is a schematic explanatory view showing component mounting operation of the prior art component mounting apparatus.

Next, with respect to the configuration related to control in the component mounting apparatus 101, a control block diagram showing the configuration of a mounting control unit 200, which is an example of the control unit included in the component mounting apparatus 101, is shown in FIG. 21.

As shown in FIG. 21, the mounting control unit 200 includes a component-feed-unit control section 201 for performing control of feed operation with the components 3 or the like by the component feed unit 40, an inversion-head-section control section 202 for performing control of sucking-and-holding/hold-releasing operation, inversion operation, move operation and the like for the components 3 by the inversion head section 21, a transfer-head-section control section 203 for performing control of sucking-and-holding/hold-releasing operation, up-and-down operation and the like for the components 3 by the transfer head section 23, a flux-supply-unit control section 204 for performing control of move operation for the flux containing section 31, uniform-thickness-layer formation process and the like by the flux supply unit 30, and a mounting-head-unit control section 205 for performing control of sucking-and-holding/hold-releasing operation for the components 3 by the mounting head unit 10, move and up-and-down operations or the like by the mounting head section 11. Further, the mounting control unit 200 has a component-holding-unit control section 206 for performing control of sucking-and-holding/hold-releasing operation for the board 2 by the stage 51 of the board holding unit 50, move operation for the board 2 by the X-Y stage 52 and the like, and a board-conveyance-unit control section 207 for performing control of conveyance operation for the board 2 by the board conveyance unit 80. The mounting control unit 200 is enabled to exert the operation controls in the individual control sections integrally in association with one another, and the execution of such integrated control makes it possible to perform the mounting of the individual components 3 onto the board 2 in the component mounting apparatus 101.

Figure 4:
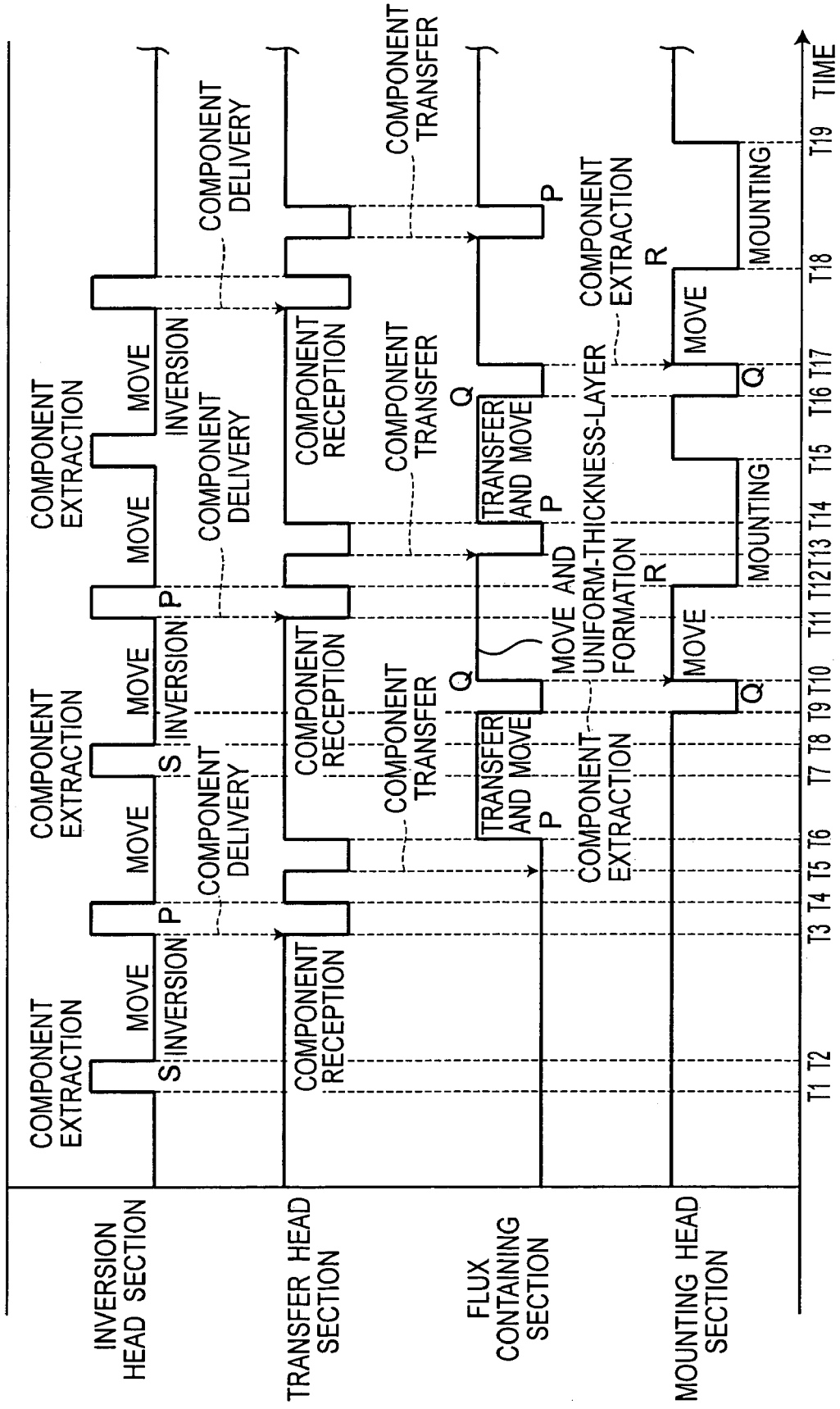
FIG. 4 is a timing chart showing operation timings of individual constituent sections in the component mounting apparatus.

Next, with respect to the component mounting apparatus 101 have the configuration described above, the operation of mounting each component 3 onto the board 2 is described. A timing chart showing mutual operational relations among the inversion head section 21, the transfer head section 23, the flux containing section 31 and the mounting head section 11 in this component mounting operation is shown in FIG. 4. Also, flowcharts showing contents and procedures of operations of the inversion head section 21, the transfer head section 23, the flux containing section 31 and the mounting head section 11 are shown FIGS. 5 and 6. In addition, in FIG. 4, contents of the operations of the individual constituent members are shown on the vertical axis, while singular time points in the individual operations are shown by T1-T19, respectively, on the horizontal axis as a time base. Also, in the component mounting operation of the components 3 onto the board 2, which will be described below, the operation is controlled in the individual control sections included in the mounting control unit 200 while their individual operations are controlled integrally in association with one another in the mounting control unit 200.

Figure 5:
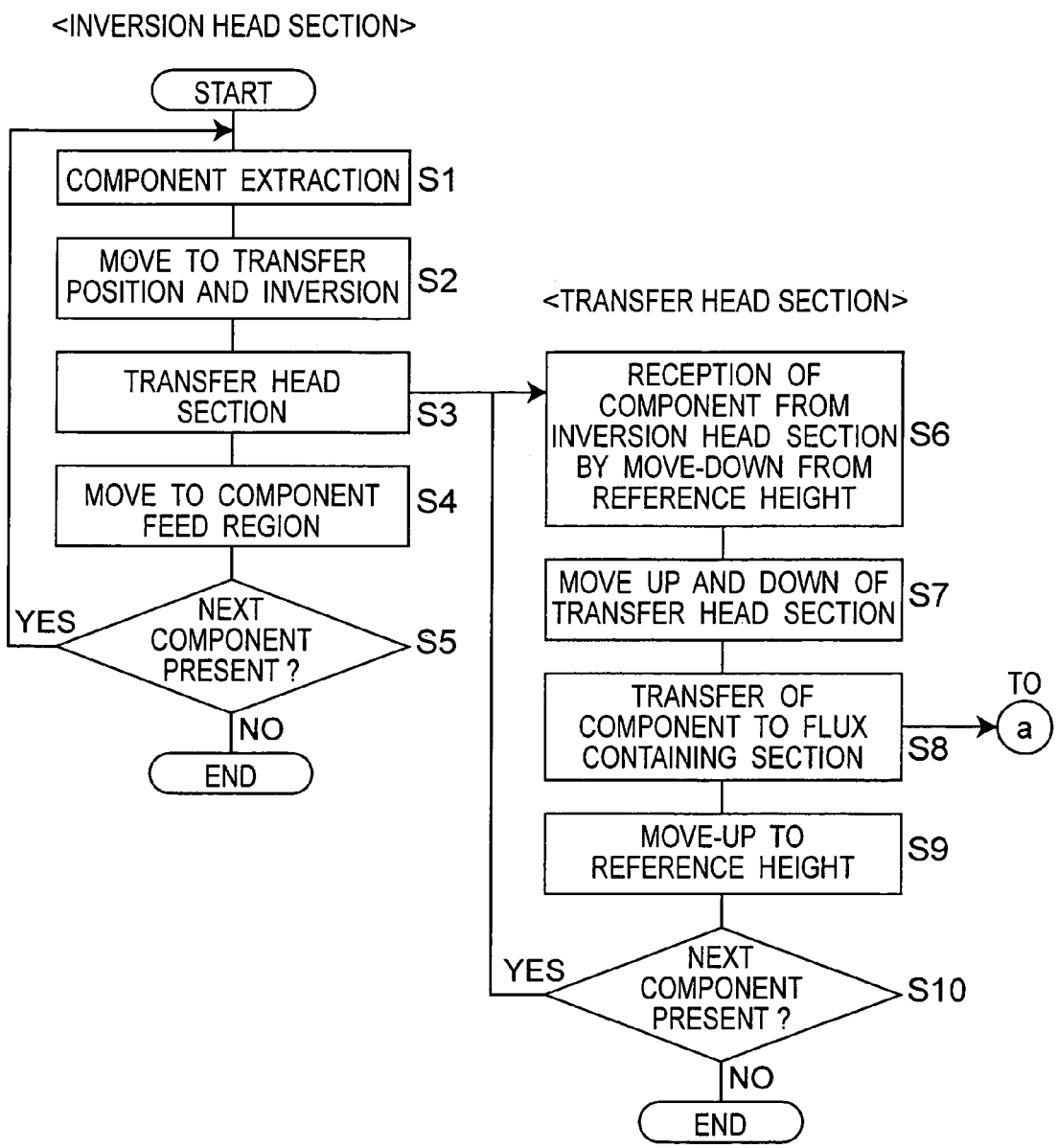
FIG. 5 is a flowchart showing the procedure of component mounting in the component mounting apparatus.
Figure 6:
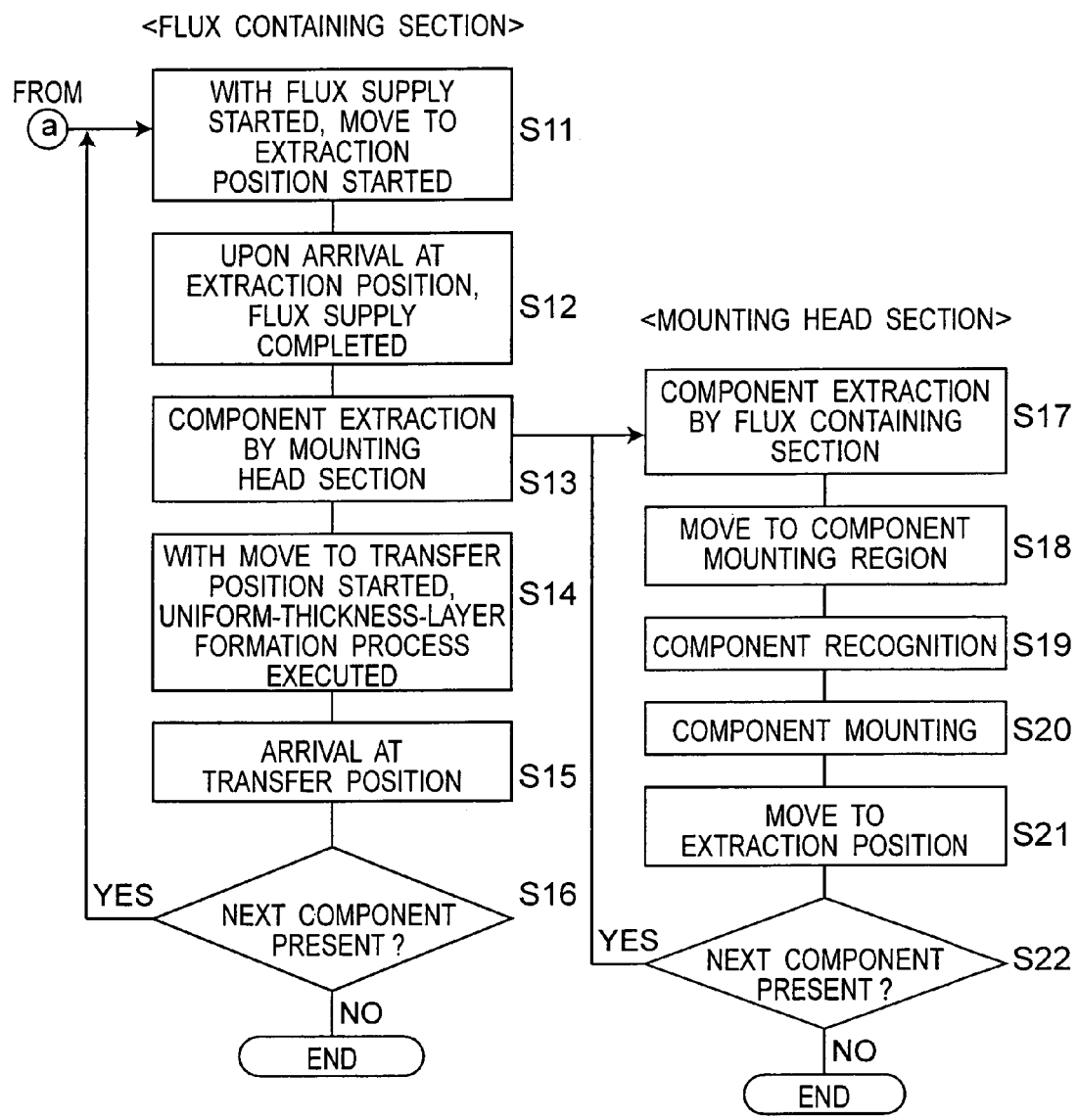
FIG. 6 is a flowchart showing the procedure of component mounting in the component mounting apparatus.

First, an explanation is given with reference to the schematic view of FIG. 3 and the flowcharts of FIGS. 5 and 6.

At step S1 of FIG. 5, the mounting-side surface 3a of the component 3 set on the component placement base 41 is sucked and held by the inversion head section 21 located in the component feed region S, by which an extraction of the component 3 is fulfilled. Thereafter, at step S2, the inversion head section 21 is moved from the component feed region S to the transfer position P by the inversion-head-section moving unit 22. Along with this, during this move process, an inversion operation of the inversion head section 21 is performed, making an inversion of the component 3 so that the mounting-side surface 3a of the sucked and held component 3 faces downward. Upon arrival at the delivery position P, at step S3, the component 3 is delivered to the transfer head section 23 that has been moved down. Then, at step S4, the inversion head section 21 that has delivered the component 3 is moved to the component feed region S by the inversion-head-section moving unit 22. At step S5, it is decided whether or not a component 3 to be extracted next is present, where if a component 3 to be extracted next is present, the operations of steps S1 to S4 are iteratively performed in sequence. If no component 3 to be extracted next is present, the operation by the inversion head section 21 is ended.

Next, the transfer head section 23 that has received the component 3 from the inversion head section 21 at step S6 is moved up at step S7, and after this move-up, the move of the inversion head section 21 in step S4 is performed. This move-up operation is an operation for preventing the inversion head section 21 and the transfer head section 23 from interfering with each other. Subsequently, a move-down operation of the transfer head section 23 is started at step S7, and the component 3 is transferred to the flux containing section 31 that is placed at the delivery position P (step S8). This transfer is carried out in the way that the individual bump electrode portions 3b of the component 3 sucked and held by the transfer head section 23 are brought into contact with the flux layer 32 of the flux containing section 31 with a specified pressing force and then the suction and hold is released. Thereafter, at step S9, the transfer head section 23 is moved up to a preset reference height position, e.g., an upper end position of the up/down operation range or a neighborhood thereof. In addition, at step S10, it is decided whether or not a component 3 to be transferred next is present, where if such a component 3 is present, the operations of steps S6 to S9 are iteratively performed in sequence. If no next-coming component 3 is present, the operation by the transfer head section 23 is ended.

Next, at step S11 of FIG. 6, as the component 3 is placed in the flux containing section 31, the flux supply to the individual bump electrode portions 3b of the component 3 is started while the movement of the flux containing section 31 by the containing-section moving unit 32 from the delivery position P to the extraction position Q is started. It is noted that the start of this move is effected after the transfer head section 23 has been moved up so as to avoid interference with the flux containing section 31 or the like. Also, during this move process, the flux supply to the component 3 is carried out. After that, when the flux containing section 31 has reached the extraction position Q, the flux supply is completed (step S12). Then, the mounting head section 11 placed at the extraction position Q is moved down, sucking and holding the component 3 and then is moved up, and thus the component 3 is extracted (step S13).

Thereafter, the flux containing section 31 that has been over the extraction of the component 3 starts to be moved toward the transfer position P by the containing-section moving unit 32, while concurrently with the start of this move, uniform-thickness-layer formation process by the uniform-thickness-layer formation processing section 35 is executed (step S14). Then, the flux containing section 31 is made to reach the transfer position at step S15, and it is decided at step S16 whether or not a next component 3 is present. If the next component 3 is transferred, the steps S11 to S15 are iteratively executed in sequence. If the next component 3 is not present, the operation by the flux containing section 31 (or flux supply unit 30) is ended.

Next, the mounting head section 11, which has sucked and held and thereby extracted the component 3 at the extraction position Q at step S17, is moved to the component mounting region R by the mounting-head-section moving unit 12 at step S18. Along with this move, an image of the sucking-and-holding posture of the component 3 is captured by the image pickup camera 13 (step S19), while concurrently alignment between the component 3 and the mounting position of the component 3 in the board 2 is performed by movement of the stage 51 in the X-axis direction or Y-axis direction by the X-Y table 52.

Thereafter, at step S20, the mounting head section 11 is moved down, and the flux-supplied bump electrode portions 3b in the mounting-side surface 3a of the component 3 are brought into contact with the mounting position in the board 2. Then, the component 3 is pressed against the board 2 for a specified time with a specified pressing force by the mounting head section 11, while the component 3 is heated by this mounting head section 11 so that the bump electrode portions 3b are heat melted. This melting can be carried out in a successful state since the surfaces of the individual bump electrode portions 3b are supplied with flux. Thereafter, the bump electrode portions 3b are cooled and solidified and moreover the suction and hold by the mounting head section 11 is released, where the mounting head section 11 is moved up, by which the mounting of the component 3 via the individual bump electrode portions 3b is fulfilled (step S20). Along with this mounting operation, heating of the board 2 by the stage 51 is also done. The mounting head section 11, which has fulfilled the mounting operation of the component 3, is moved to the extraction position Q by the mounting-head-section moving unit 12 (step S21). Along with this, it is decided at step S22 whether or not a component 3 to be mounted next is present, where if another component 3 to be mounted is present, the steps S17 to S21 are iteratively performed in sequence. If another component 3 to be mounted next is not present, the operation by the mounting head section 11 is ended.

Figure 27:
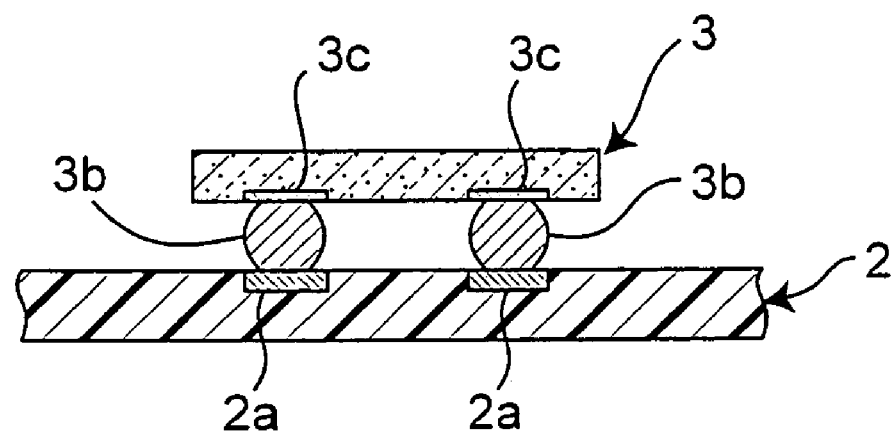
FIG. 27 is a schematic sectional view showing a state that a component according to the embodiment of the present invention has been mounted on the board.

Now a schematic sectional view showing a mounting state of the component 3 onto the board 2 is shown in FIG. 27. As shown in FIG. 27, the component 3 has a plurality of electrodes 3c on its mounting-side surface 3a (lower surface in the figure), and the bump electrode portions 3b are formed on the individual electrodes 3c, respectively. Further, a plurality of board electrodes 2a are formed on the board 2 in correspondence to the placement of the individual electrodes 3c of the component 3, and the component 3 is mounted on the board 2 in a state that the bump electrode portions 3b are bonded to the board electrodes 2a, respectively. Although the surfaces of the individual bump electrode portions 3b have been supplied with flux prior to the heat melting as described before, yet it is not shown in the figures because the bump electrode portions 3b in FIG. 27 are in a state after the heating and melting.

Figure 28:
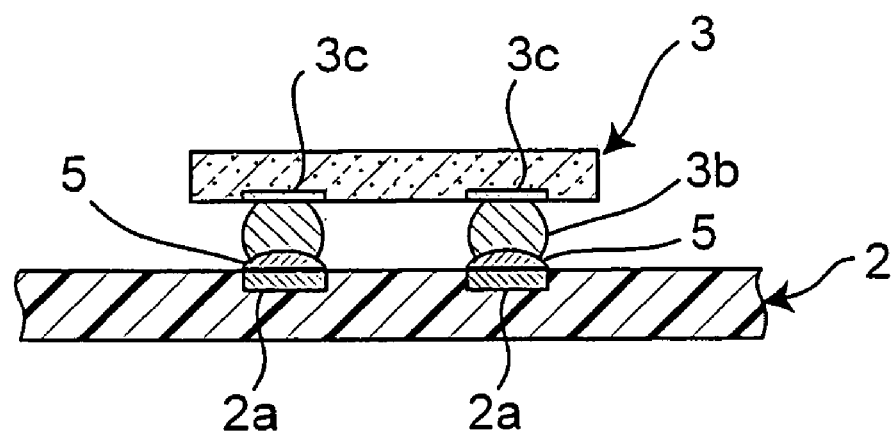
FIG. 28 is a schematic sectional view showing a modification example of the mounted state of the component on the board in FIG. 27.

Further, instead of such a case where the bonding is done while the bump electrode portions 3b are in direct contact with the board electrodes 2a of the board 2, respectively, as shown above, it is also possible that, as shown in FIG. 28, solder portions (solder plated portions) 5 are preliminarily formed on the board electrodes 2a, respectively, with solder or other bonding material supplied thereto, so that the bump electrode portions 3b and the board electrodes 2a are bonded to each other via the solder portions 5, respectively. In such a case, flux supplied to the bump electrode portions 3b serves to obtain a good state not only of the bump electrode portions 3*b* but also of the molten state of the solder portions 5. In addition, at the individual board electrodes 2*a*, plated portions may also be formed by using metal material other than solder, for example, gold.

Next, with respect to the component mounting apparatus 101 that performs the component mounting operation of the procedure shown above, mutual operating states of its constituent members in the process that the mounting operation is carried out with a plurality of components 3 continuously fed are described with reference to the timing chart of FIG. 4. It is noted that the timing chart of FIG. 4 gives a timing chart associated with component mounting operation for, for example, two components 3 (examples of a first component and a second component) as the aforementioned plurality of components for an easier understanding of the description. Also, timing charts for individual constituent members are those showing not only the ON/OFF state of the motor or the like or the presence or absence of mounting operation but also which operation out of a plurality of operations performed by the individual members is being carried out.

As shown in FIG. 4, in a time interval T1-T2, a component 3 is extracted from the component placement base 41 by the inversion head section 21. This component 3 is assumed as a first component 3-1. Next, in a time interval T2-T3, the inversion head section 21 is moved from the component feed region S to the transfer position P, while an inversion operation of the inversion head section 21 is performed. Then, in a time interval T3-T4, the first component 3-1 is delivered from the inversion head section 21 to the transfer head section 23 at the transfer position P. The transfer head section 23, which has received the first component 3-1, is moved up and down in a time interval T4-T5, during which the move of the inversion head section 21 from the transfer position P to the component feed region S is started.

On the other hand, the first component 3-1 is transferred from the transfer head section 23 to the flux containing section 31 in a time interval T5-T6, and the flux containing section 31 is moved from the transfer position P to the extraction position Q in a time interval T6-T9. Thereafter, in a time interval T9-T10, the first component 3-1 is extracted from the flux containing section 31 by the mounting head section 11 at the extraction position Q. It is noted that the flux supply to the first component 3-1 is performed in a time interval T5-T10, the flux supply being completed by the arrival of the flux containing section 31 at the extraction position Q, more strictly, by the extraction of the first component at the extraction position Q.

Moreover, the inversion head section 21, which has reached the component feed region S, extracts a next component 3, i.e. a second component 3-2, in a time interval T7-T8 before the completion of the flux supply to the first component 3-1. In a time interval T8-T11, the inversion head section 21 is moved from the component feed region S toward the transfer position P, while being inverted.

In parallel with this operation, in a time interval T10-T12, the mounting head section 11 sucking and holding the first component 3-1 is moved from the extraction position Q toward the component mounting region R. Along with this, in a time interval T10-T13, the flux containing section 31, from which the first component 3-1 has been extracted, is moved to the transfer position P, while during this move, uniform-thickness-layer formation process is carried out.

Thereafter, mounting operation of the first component 3-1 onto the board 2 by the mounting head section 11 is performed in a time interval T12-T15. In parallel with the mounting operation of the first component 3-1, the second component 3-2 is delivered from the inversion head section 21 to the transfer head section 23 in a time interval T11-T12. Thereafter, before the mounting operation of the first component 3-1 is completed at the time T15, the second component 3-2 is transferred from the transfer head section 23 to the flux containing section 31 in a time interval T13-T14, where flux supply to the second component 3-2 is started.

Meanwhile, the mounting head section 11, which has completed the mounting operation of the first component 3-1, is moved to the extraction position Q in a time interval T15-T16. From the flux containing section 31 that has been moved to the extraction position Q in a time interval T14-T16, the second component 3-2 is extracted by the mounting head section 11 in a time interval T16-T17.

Thereafter, the mounting head section 11 is moved to component mounting region R in a time interval T17-T18, and the mounting operation of the second component 3-2 onto the board 2 is performed in a time interval T18-T19.

In addition, in a case where extraction of a third component 3-3 is performed in succession to the second component 3-2, the extraction of the third component 3-3 from the component placement base 41 by the inversion head section 21 is started, as shown in FIG. 4, by the time when the mounting head section 11, which has completed the mounting of the first component 3-1 at the time T16, completes the move for return to the extraction position Q.

For an easier understanding of the operating procedure of component mounting in the component mounting apparatus 101 as described above, schematic perspective views showing states of the component mounting apparatus 101 in the component mounting process are shown in FIGS. 7 to 14.

Figure 7:
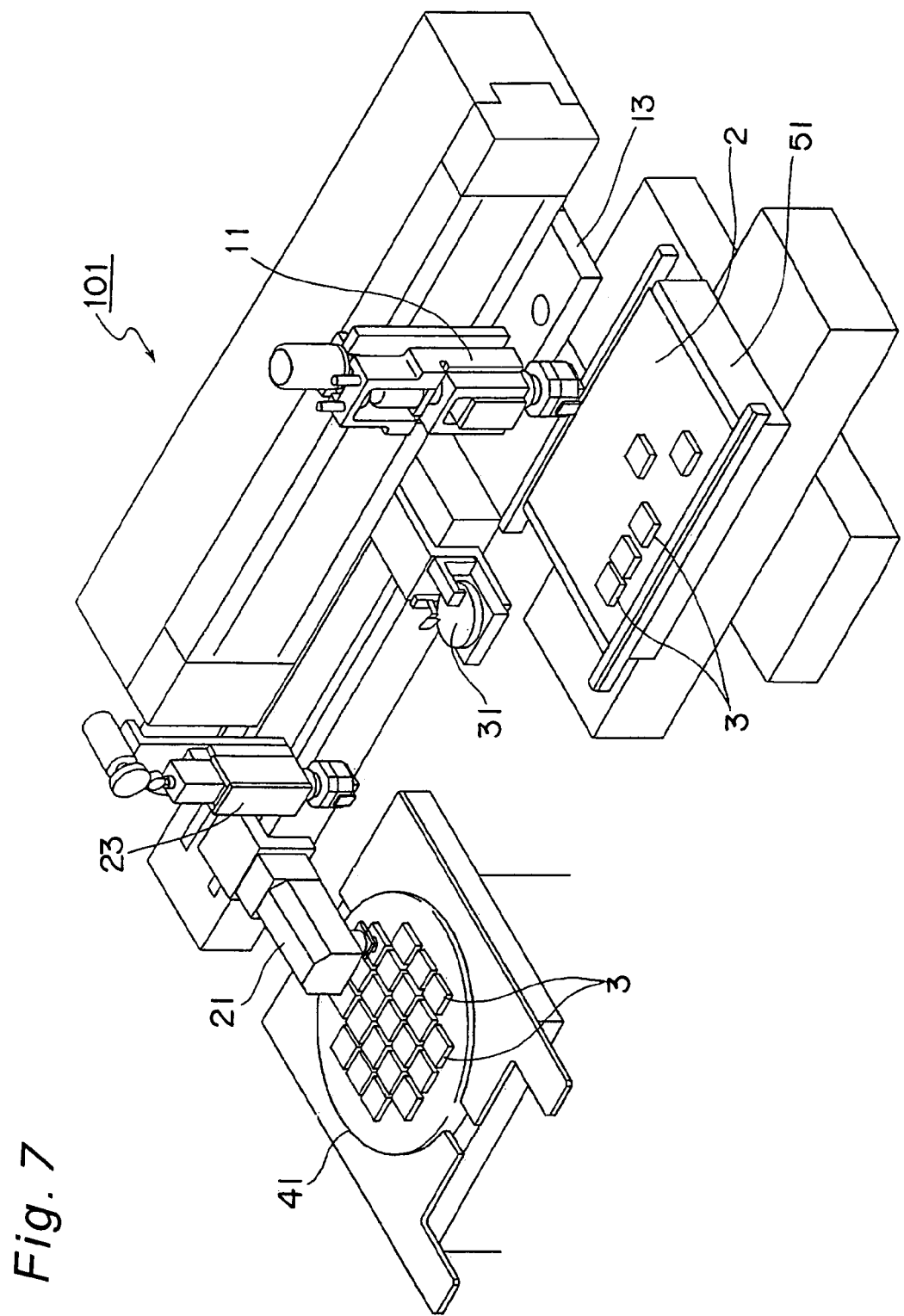
FIG. 7 is a schematic perspective view showing a state that, in the component mounting apparatus, the inversion head section is performing component extraction from the component placement base.

FIG. 7 shows a state that the inversion head section 21 is extracting the component 3 from the component placement base 41, corresponding to step S1 in the flowchart of FIG. 5.

Figure 8:
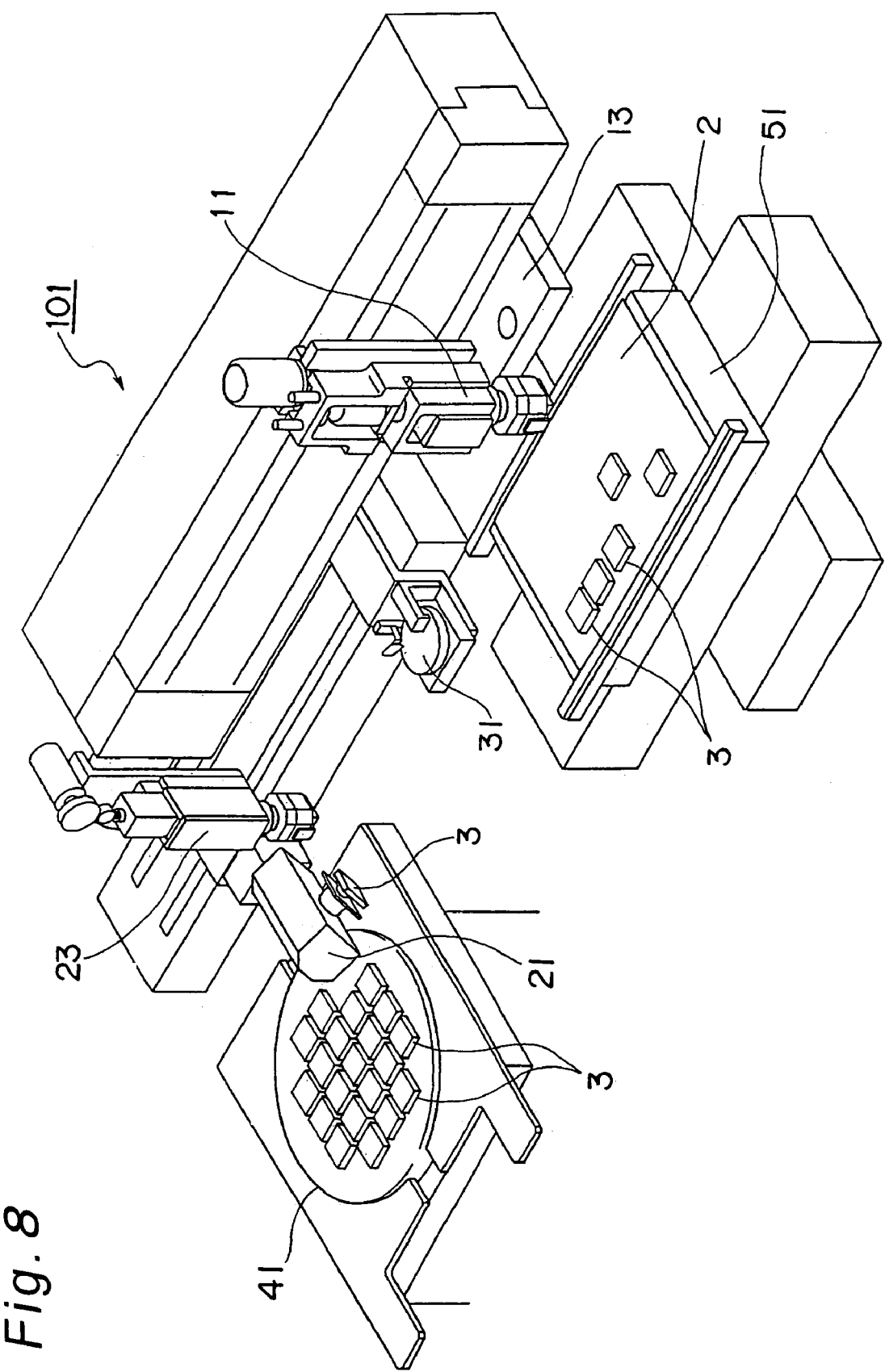
FIG. 8 is a schematic perspective view showing a state that, in the component mounting apparatus, inversion operation is being performed along with the move of the inversion head section toward the transfer position.

FIG. 8 shows a state afterwards that the inversion head section 21 has started to be moved toward the transfer position P, while its inversion operation is being performed along with the move, corresponding to step S2 of FIG. 5.

Figure 9:
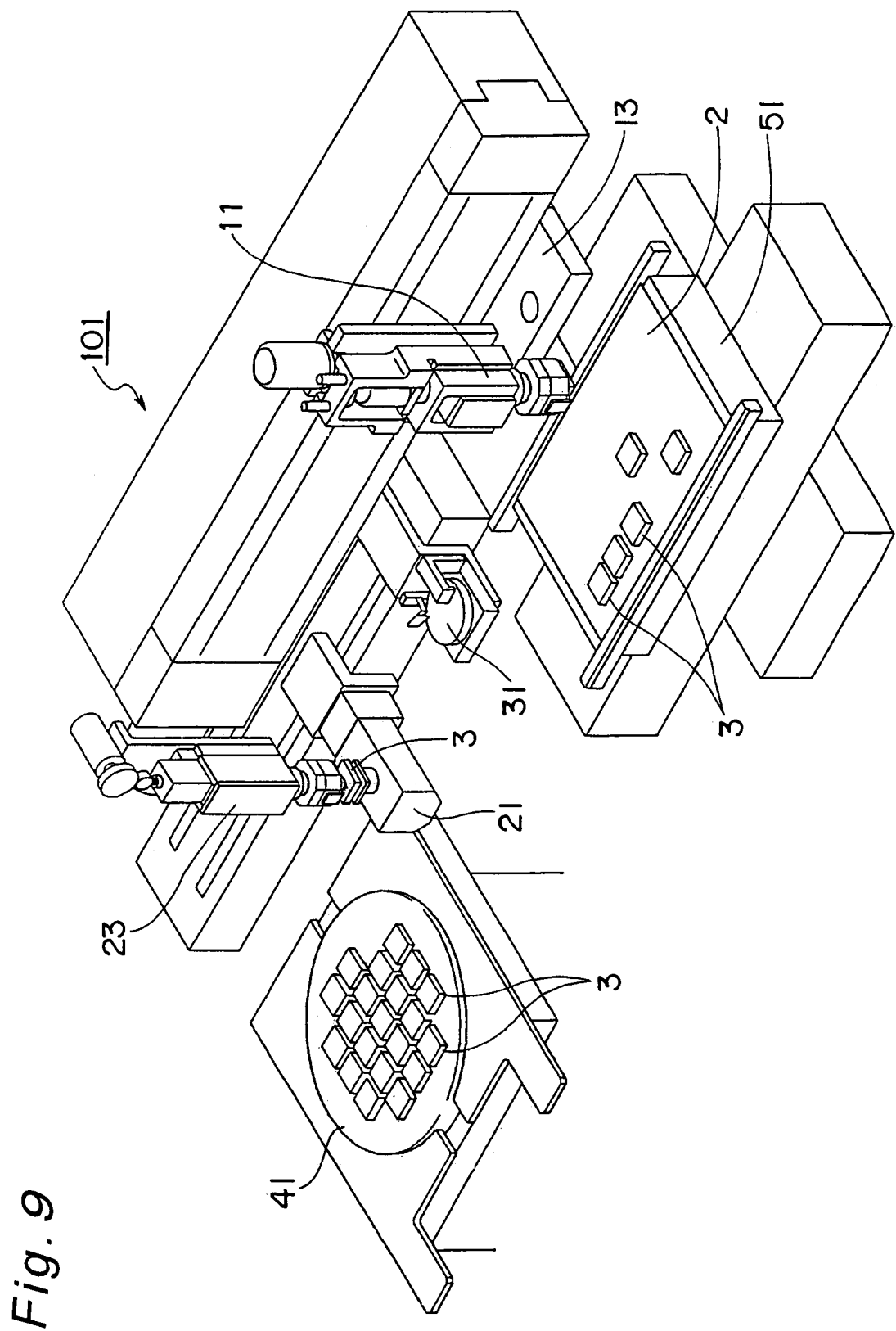
FIG. 9 is a schematic perspective view showing a state that, in the component mounting apparatus, the inversion head section has reached the transfer position, delivering the component to the transfer head section.

FIG. 9 shows a state that the inversion head section 21, which has been moved and reached the transfer position P, is delivering the component 3 to the transfer head section 23, corresponding to step S3 of FIG. 5.

Figure 10:
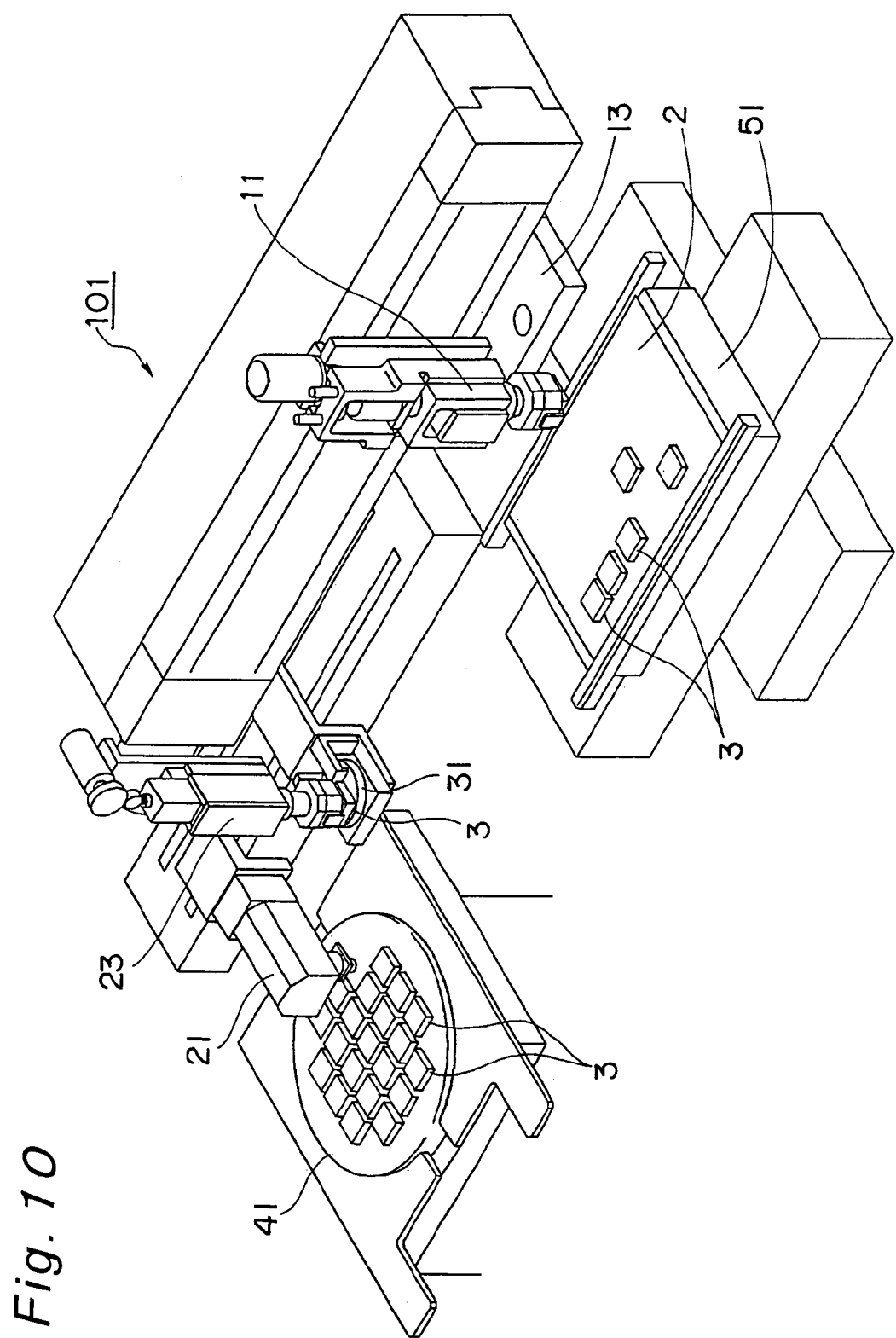
FIG. 10 is a schematic perspective view showing a state that, in the component mounting apparatus, the component is being transferred at the transfer position from the transfer head section to the flux containing section.

FIG. 10 shows a state that the component 3 is being transferred at the transfer position P from the transfer head section 23 to the flux containing section 31, corresponding to step S8 of FIG. 5.

Figure 11:
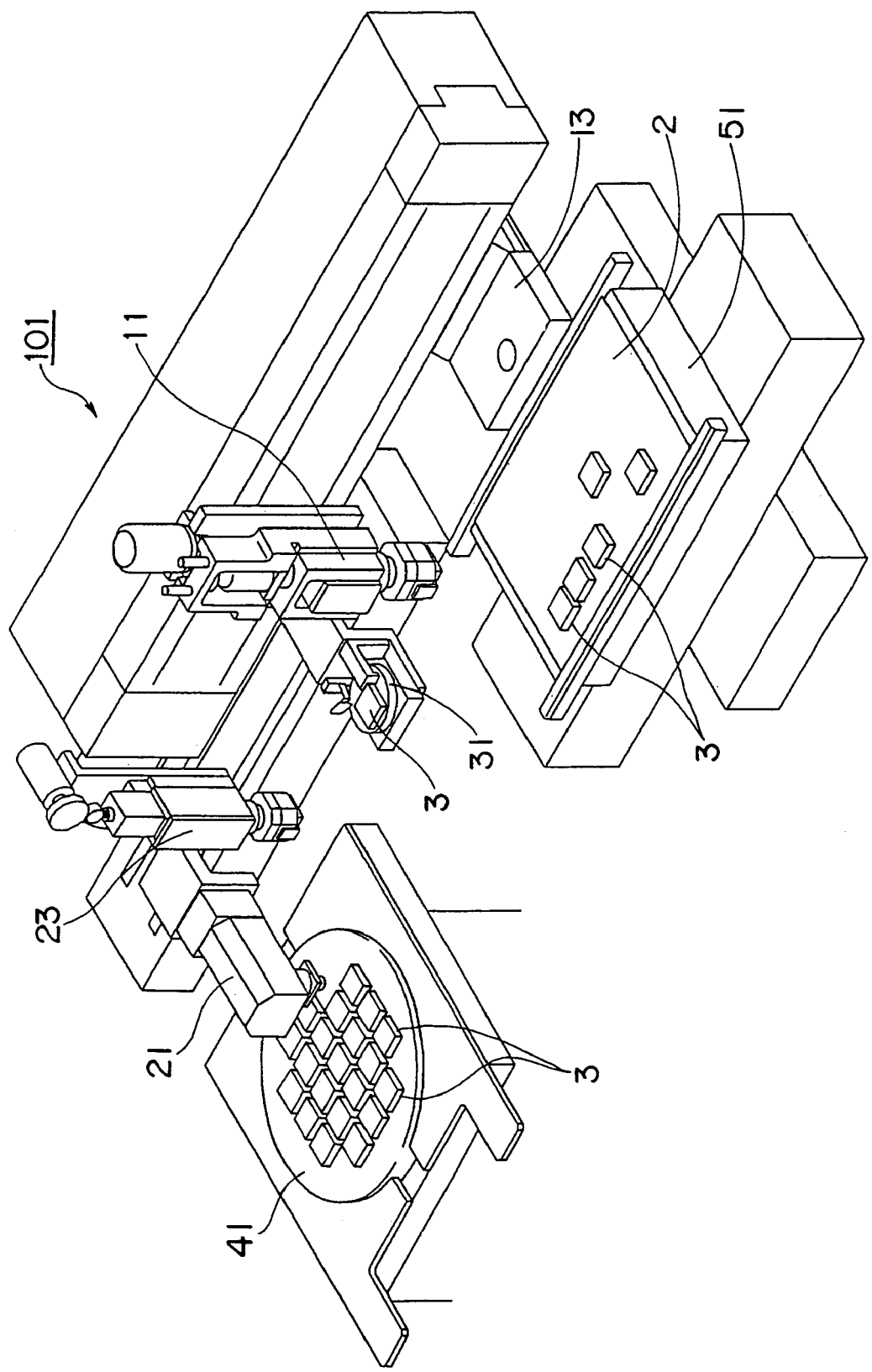
FIG. 11 is a schematic perspective view showing a state that, in the component mounting apparatus, the flux supply section to which the component has been transferred is under the move from the transfer position to the extraction position.

FIG. 11 shows a state that the flux supply section 31, to which the component 3 has been transferred, is under the move from the transfer position P to the extraction position P, i.e. a state of execution of flux supply, corresponding to step S11 of FIG. 6.

Figure 12:
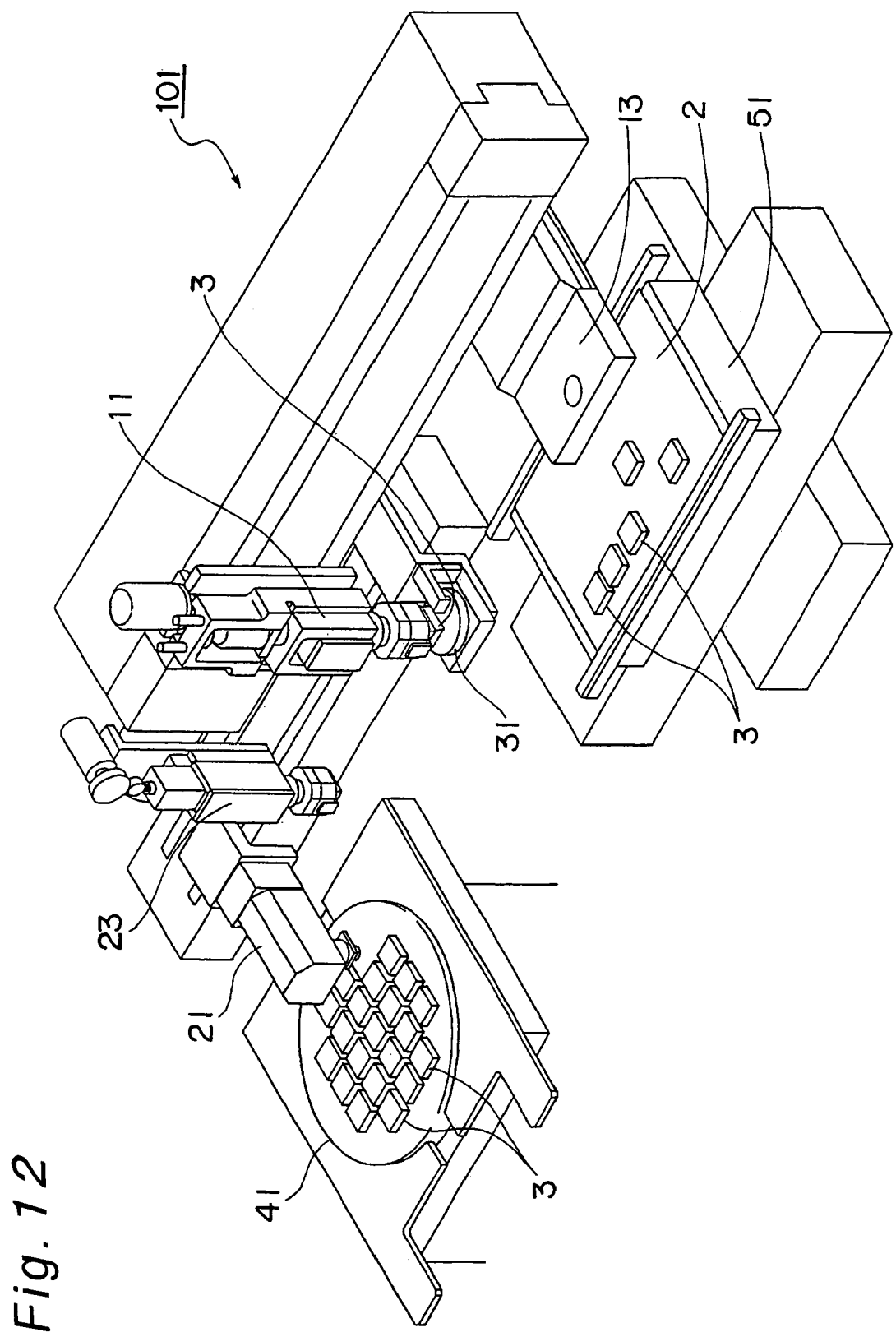
FIG. 12 is a schematic perspective view showing a state that, in the component mounting apparatus, the component supplied with the flux is being extracted by the mounting head section from the flux containing section positioned at the extraction position.

FIG. 12 shows a state afterwards that the component 3 supplied with the flux is being sucked and held and extracted by the mounting head section 11 from the flux containing section 31 positioned at the extraction position Q, corresponding to step S17 of FIG. 6.

Figure 13:
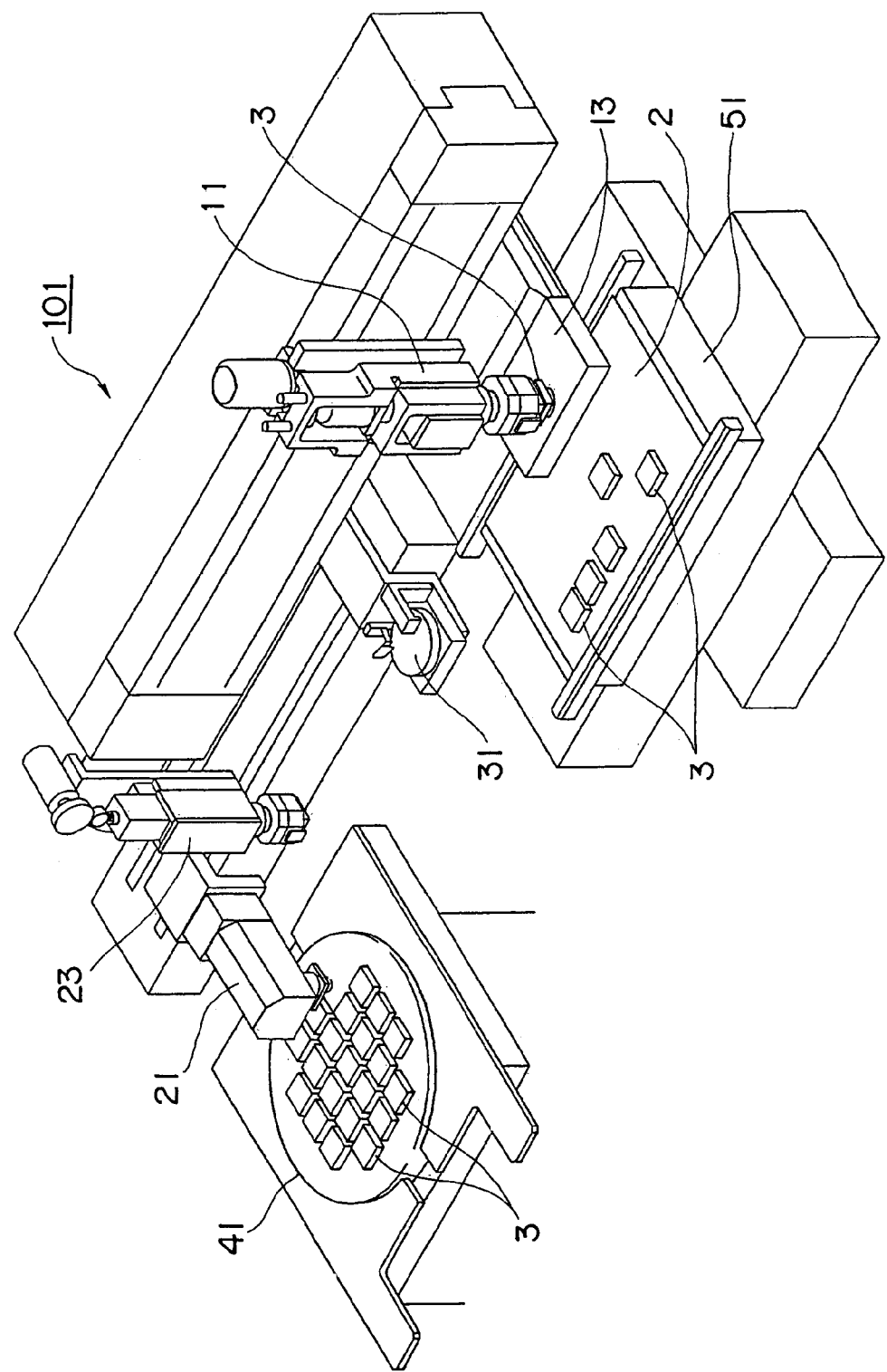
FIG. 13 is a schematic perspective view showing a state that, in the component mounting apparatus, an image of a sucking-and-holding state of the component sucked and held by the mounting head section, which has been moved to the component mounting region, is being captured by the image pickup camera.

FIG. 13 shows a state that an image of the sucking-and-holding state of the component 3 sucked and held by the mounting head section 11, which has been moved to the component mounting region R, is being captured by the image pickup camera 13.

Figure 14:
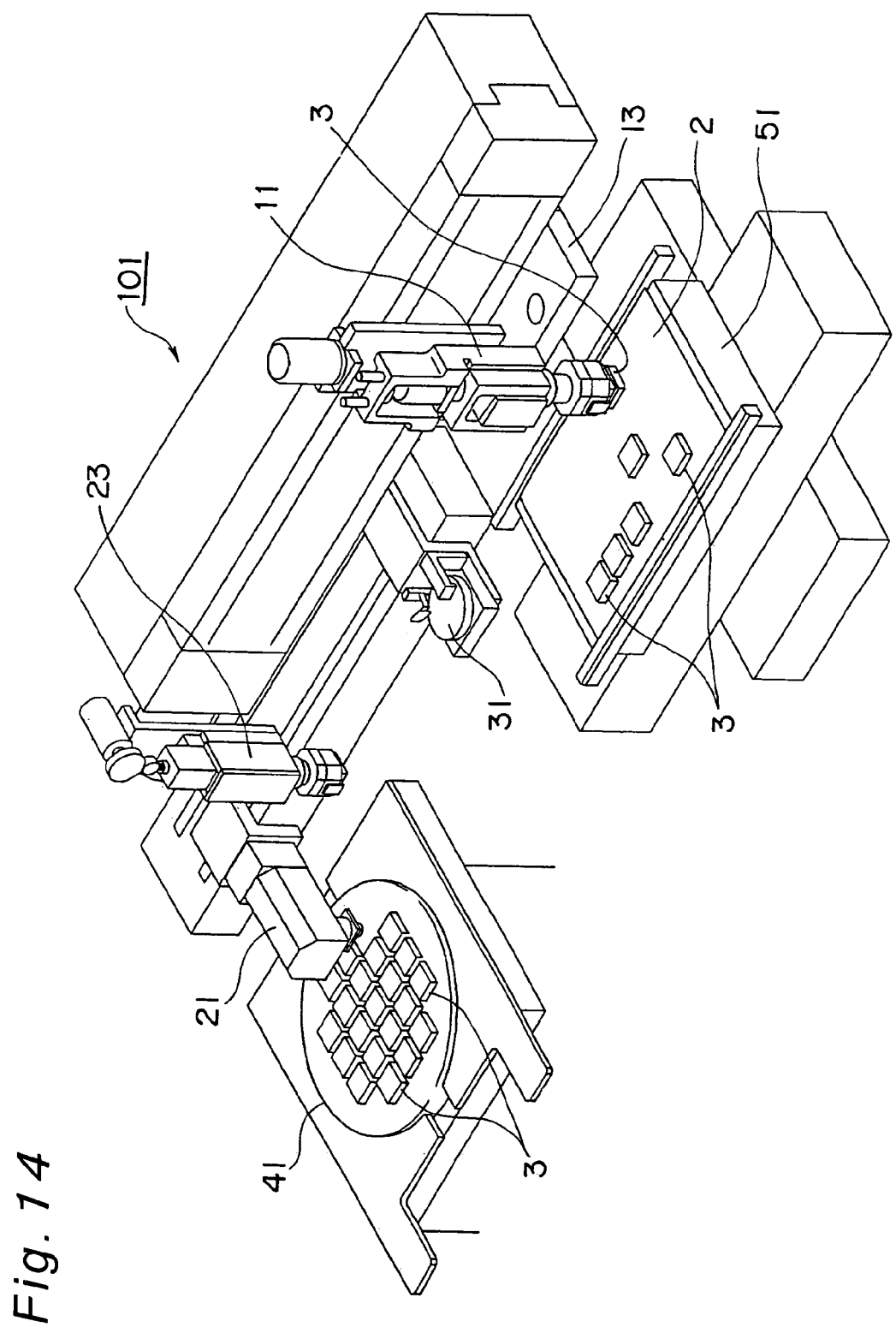
FIG. 14 is a schematic perspective view showing a state that, in the component mounting apparatus, a mounting operation of the component onto the board by the mounting head section is being performed.

FIG. 14 shows a state afterwards that a mounting operation of the component 3 onto the board 2 by the mounting head section 11 is being performed, corresponding to step S20 of FIG. 6.

The above description has been made on a case where the uniform-thickness-layer formation process by the uniformthickness-layer formation processing section 35 of the flux supply unit 30 is carried out during the move process of the flux containing section 31 from the extraction position Q to the transfer position P. However, the execution of the uniform-thickness-layer formation process is not limited only to such a case. Instead, for example, the uniform-thickness-layer formation process may be carried out after the move to the transfer position P, or before the move from the extraction position Q, or during a halt of the flux containing section 31. In the case where the uniform-thickness-layer formation process is carried out during a halt of the flux containing section 31 as shown above, the uniform-thickness-layer formation process can be done without being affected by vibrations or swings or the like of the flux layer due to the move, so that a more uniformized flux layer can be formed and successful flux supply can be provided.

Also, with respect to the component feed unit 40 in the component mounting apparatus 101, the above description has been made on a case where components 3 such as bare IC chips formed by dicing of the wafer 4 are fed. However, the type, as well as the form of feed, of the components 3 fed from the component feed unit 40 are not limited only to such a case. Instead, for example, individual components 3 such as IC chips may be fed from a component feed tray on top of which the components 3 are extractably arrayed and positioned. Otherwise, a taped component feed section (e.g., cassette feeder etc.) capable of feeding taped components in which a plurality of components 3 such as chip components are continuously extractably housed may be provided so that the taped components are continuously fed from the taped component feed section to thereby continuously feed the individual components 3. Even in such types of components 3 and forms of component feed, since the components 3 are fed with their mounting-side surfaces facing up, the inversion operation after the suction and extraction by the inversion head section 21 is necessary. Furthermore, the various forms of component feed may be provided in combination in the component feed unit 40, in which case the component mounting apparatus 101 is enabled to manage the mounting of various types of components 3.

Moreover, this embodiment is not limited to the above-described component mounting apparatus 101, but may be carried out in various modes. Several component mounting apparatuses according to modification examples of this embodiment will be described below. In the component mounting apparatuses according to the respective modification examples shown below, individual constituent members having the same structures as those of the component mounting apparatus 101 will be designated by the same reference numerals.

Figure 15:
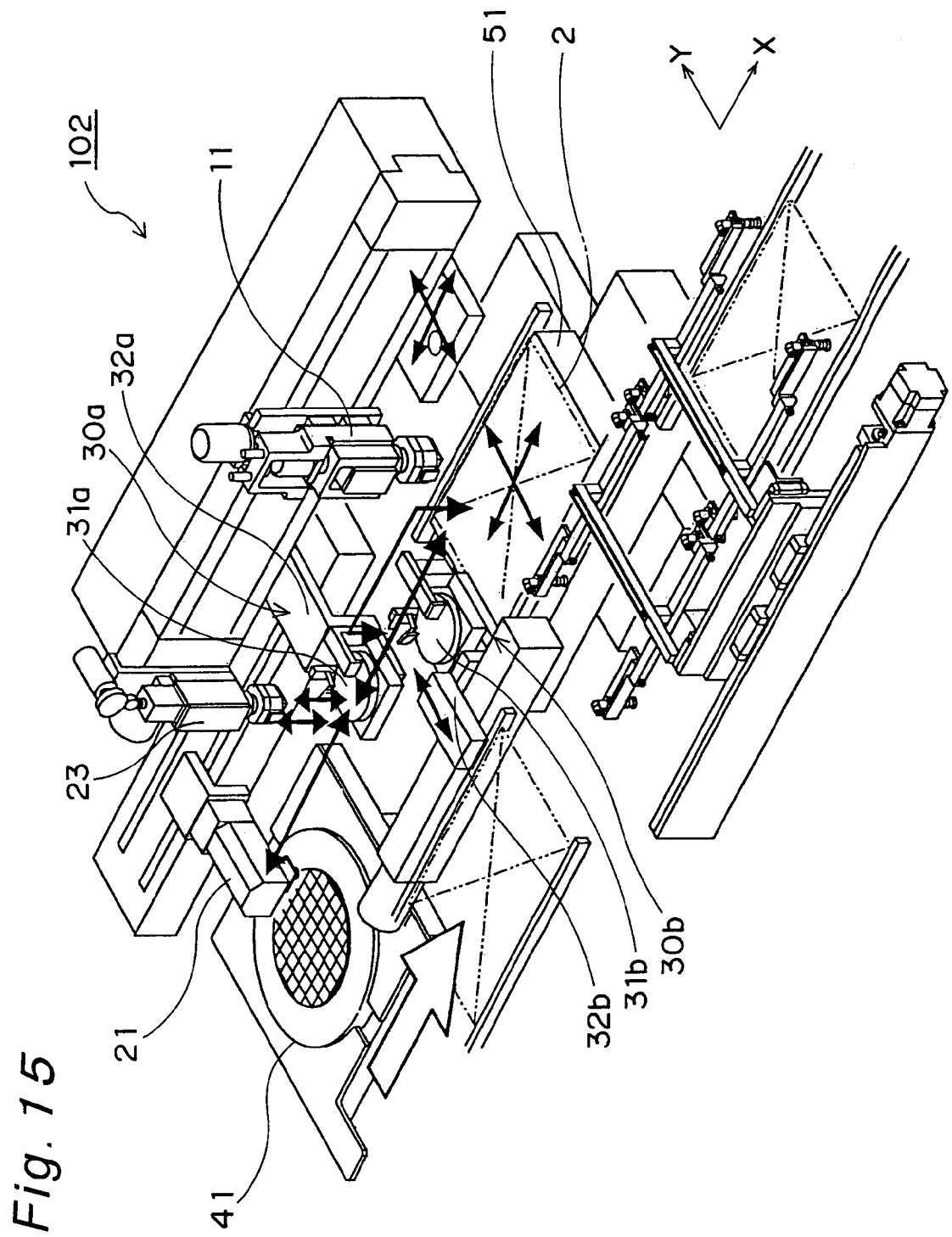
FIG. 15 is a schematic perspective view of a component mounting apparatus according to a first modification example of the embodiment of the present invention, showing a component mounting apparatus including two flux supply units.

First, a schematic perspective view showing the structure of a component mounting apparatus 102 according to a first modification example of the component mounting apparatus of this embodiment is shown in FIG. 15.

As shown in FIG. 15, the component mounting apparatus 102 differs from the component mounting apparatus 101 in including two flux supply units, but is similar to the component mounting apparatus 101 in the rest of the structure. This different portion only will be described below.

The component mounting apparatus 102 shown in FIG. 15 has two flux supply units 30a, 30b between the component placement base 41 and the stage 51. The flux supply units 30a, 30b include flux containing sections 31a, 31b and containing-section moving units 32a, 32b, respectively. Also, the containing-section moving units 32a, 32b are so placed as to extend along the X-axis direction in the figure and be opposed to each other. The containing-section moving unit 32a is enabled to perform operation similar to that of the containing-section moving unit 32 in the component mounting apparatus 101, more specifically, to make the flux containing section 31a move linearly along the X-axis direction between unshown transfer position P and extraction position Q. In contrast to this, the containing-section moving unit 32b, although likewise making the flux containing section 31b move between unshown transfer position P and extraction position Q, yet is enabled to make the flux containing section 31b move also in the Y-axis direction. As a result of this, it is practicable to move the flux containing section 31b in such a manner as to draw a roughly U-shaped planar locus in moves in the X-axis direction or Y-axis direction in the figure while preventing interference with the flux containing section 31a.

According to the component mounting apparatus 102 as shown above, since the components 3 supplied with flux by the two flux supply units 30a, 30b can be fed to the mounting head section 11, the time required for flux supply can substantially be shortened. This is effective particularly when the time required for flux supply is lengthened depending on the type or characteristic of the flux or the formation material of the bump electrode portions 3b of the components 3 or the like, or when the time required for mounting operation of the component 3 onto the board 2 by the mounting head section 11 is shorter as compared with the time required for flux supply. Thus, it becomes practicable to fulfill efficient, higher-speed component mounting.

Figure 16:
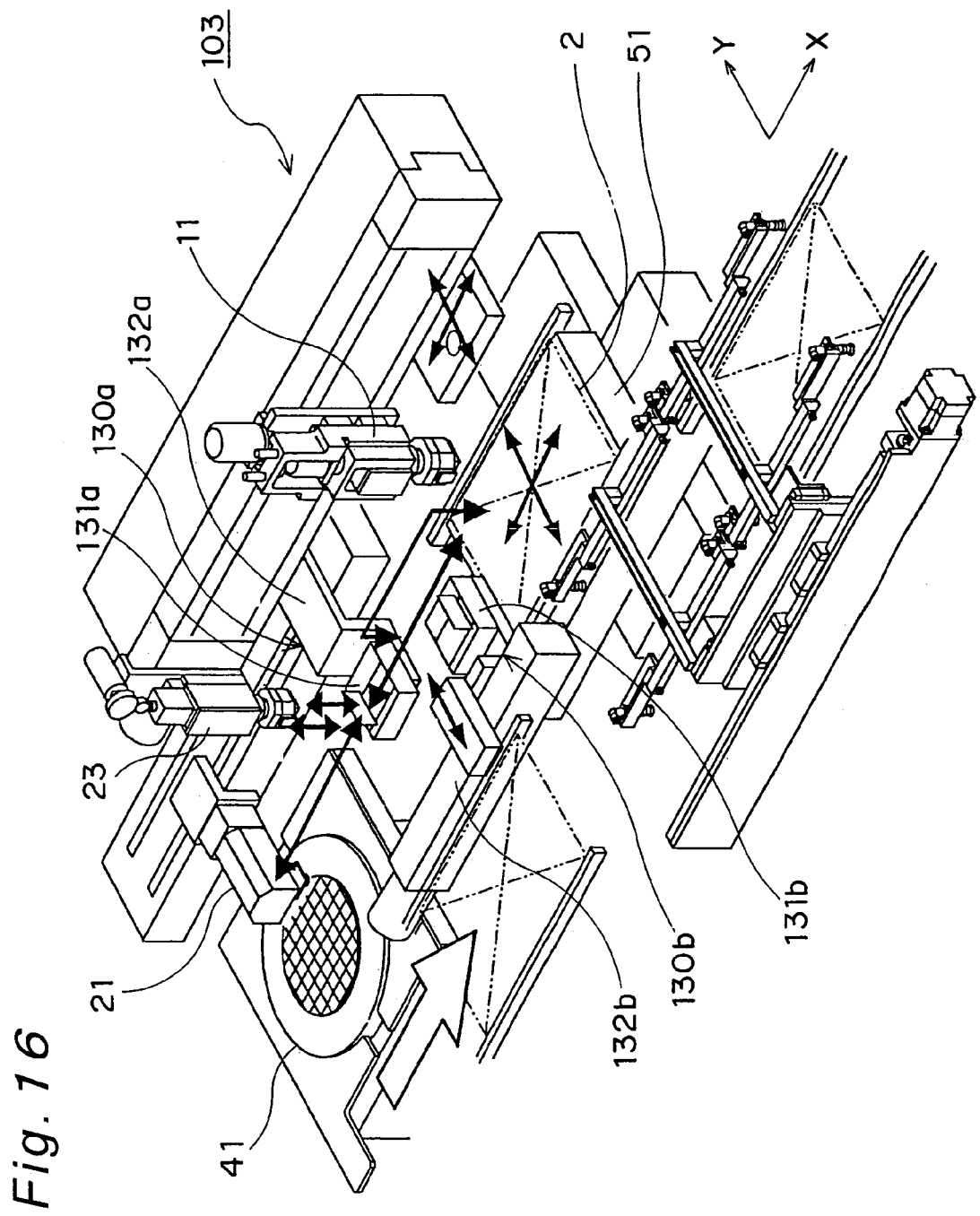
FIG. 16 is a schematic perspective view of a component mounting apparatus according to a second modification example of the embodiment of the present invention, showing a component mounting apparatus including two squeegee-type flux supply units.

Next, a schematic perspective view showing the structure of a component mounting apparatus 103 according to a second modification example of the component mounting apparatus of this embodiment is shown in FIG. 16.

As shown in FIG. 16, the component mounting apparatus 103 includes flux supply units 130a, 130b different in type from the flux supply units 30a, 30b included in the component mounting apparatus 102 of the first modification example.

The flux supply units 30a, 30b (i.e., flux supply unit 30), as shown in FIG. 2, each include the flux containing section 31 which contains flux contained therein, and the uniform-thickness-layer formation processing section 35 which rotates the flux containing section 31 to form the uniform-thickness-layer by using the blade kept in contact with the flux layer 32 formed on the surface of the flux containing section 31. The flux supply units are not limited to those which form a uniform-thickness-layer by rotation as shown above, but may be, for example, those using a squeegee which is moved in contact with the flux layer formed on the top surface of a flux containing section 131a or 131b to uniformize the flux layer. The flux supply units 130a, 130b included in the component mounting apparatus 103 of FIG. 16 are flux supply units of such a type using the squeegee. In addition, except the operation of the squeegee shown above, operations and functions of the individual flux supply units 130a, 130b are similar to those of the flux supply unit 30 or the like.

According to the component mounting apparatus 103 shown above, even if the uniform-thickness-layer formation process by the squeegee is performed instead of the foregoing uniform-thickness-layer formation process by rotation, similar effects to those by the component mounting apparatus 102 can be obtained.

Figure 17:
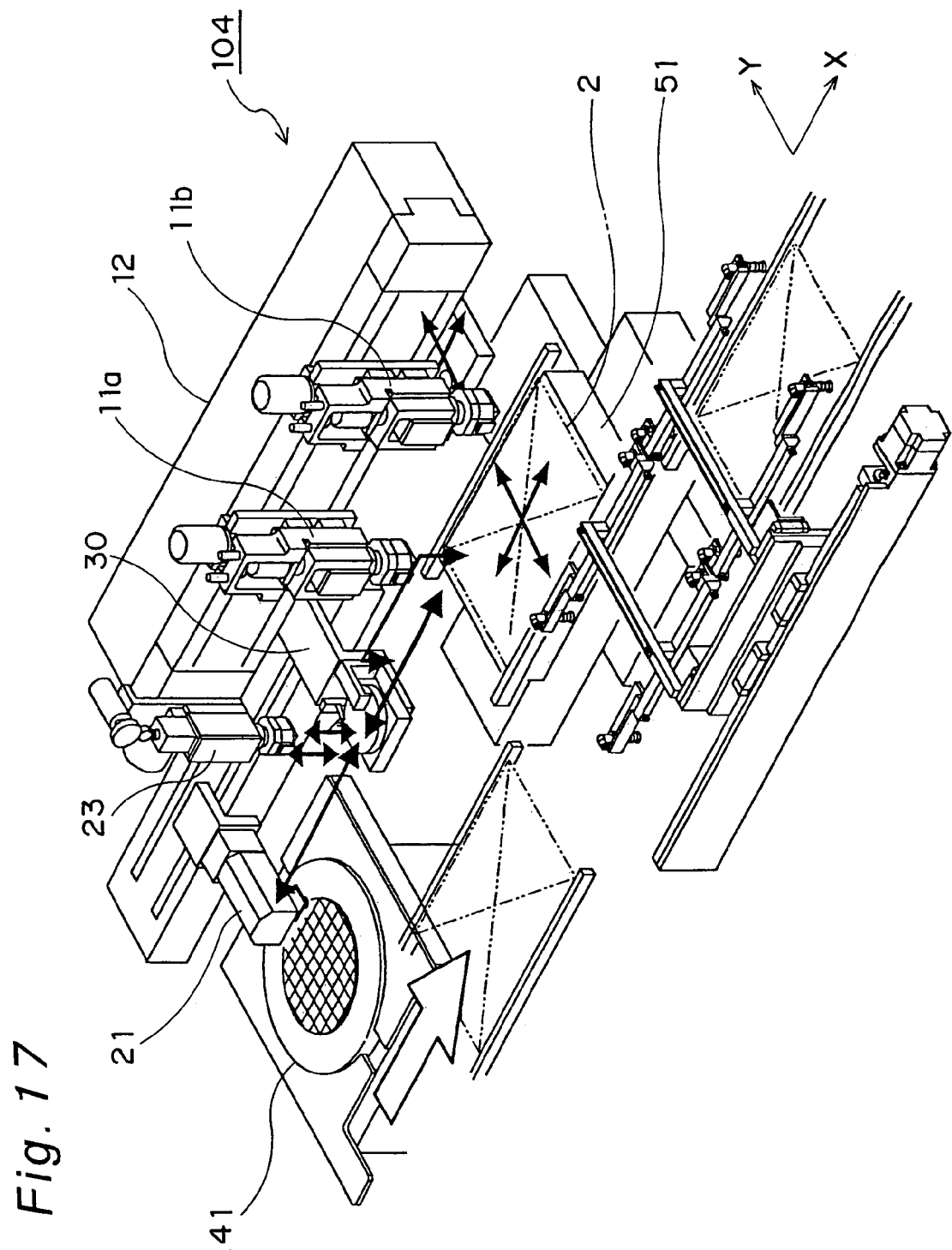
FIG. 17 is a schematic perspective view of a component mounting apparatus according to a third modification example of the embodiment of the present invention, showing a component mounting apparatus including two mounting head sections.

Next, a schematic perspective view showing the structure of a component mounting apparatus 104 according to a third modification example of the component mounting apparatus of this embodiment is shown in FIG. 17.

As shown in FIG. 17, the component mounting apparatus 104 differs from the component mounting apparatus 101 in including two mounting head sections, but is similar to the component mounting apparatus 101 in the rest of the structure. This different portion only will be described below.

As shown in FIG. 17, the component mounting apparatus 104 includes two mounting head sections 11a, 11b each having the same structure and function as the mounting head section 11. Each of the mounting head sections 11a, 11b can be moved between unshown extraction position Q and component mounting region R along the X-axis direction in the figure while supported by one mounting-head-section moving unit 12.

The component mounting apparatus 104 shown above is enabled to perform a component mounting operation that, for example, with two components 3 placed in the flux supply unit 30 and supplied with flux, the individual components 3 are extracted at the extraction position Q and mounted onto the board 2 by the mounting head sections 11a, 11b, respectively. Accordingly, it becomes practicable to fulfill efficient, higher-speed component mounting operation. In addition, in a case where two mounting-head-section moving units capable of supporting and moving the mounting head sections 11a, 11b, respectively, are provided, the time required for component mounting by the mounting head sections 11a, 11b can be further shortened, so that more efficient, higher-speed component mounting can be fulfilled.

Figure 18:
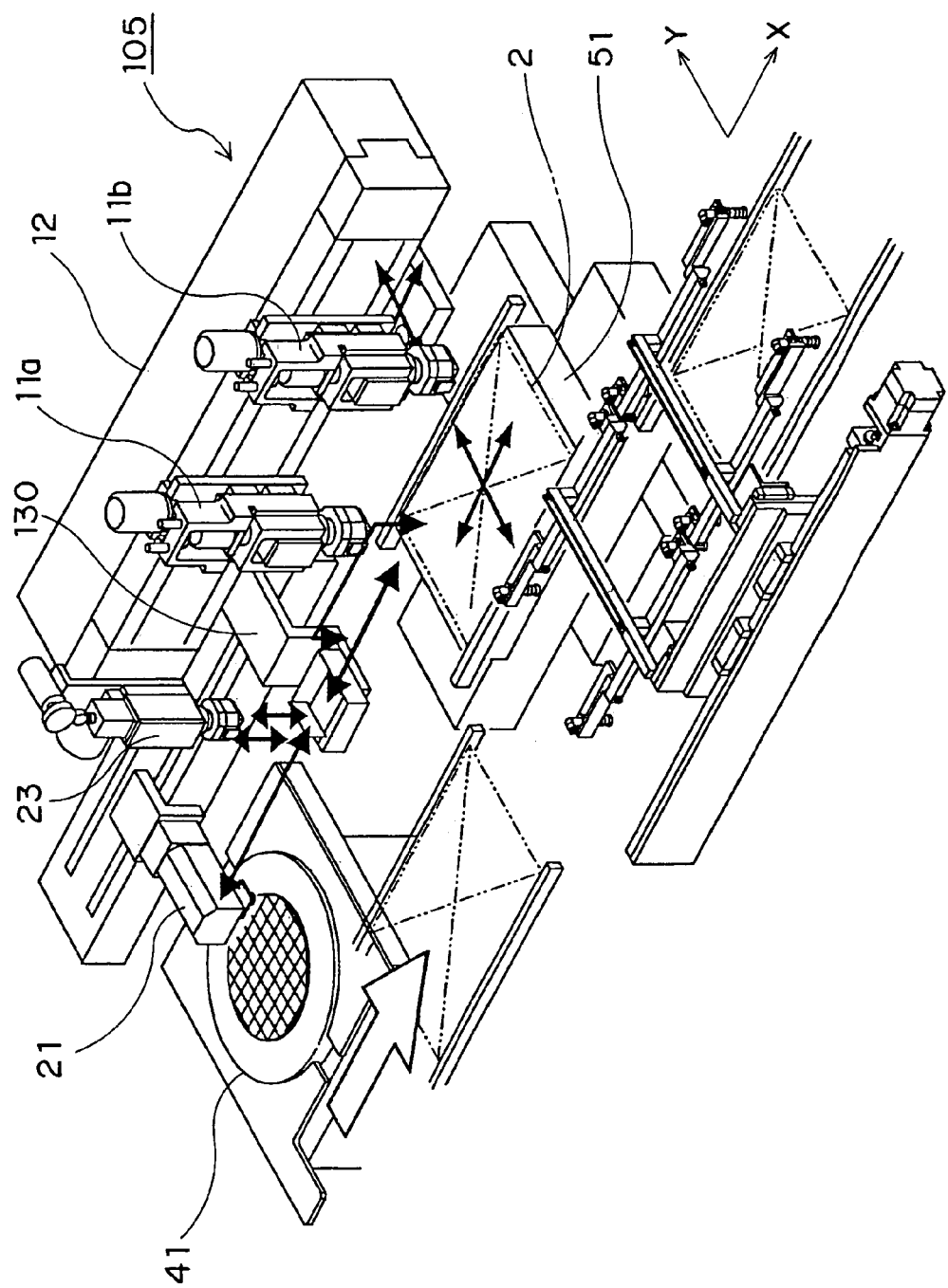
FIG. 18 is a schematic perspective view of a component mounting apparatus according to a fourth modification example of the embodiment of the present invention, showing a component mounting apparatus including two mounting head sections and a squeegee-type flux supply units.

Next, a schematic perspective view showing the structure of a component mounting apparatus 105 according to a fourth modification example of the component mounting apparatus of this embodiment is shown in FIG. 18.

As shown in FIG. 18, the component mounting apparatus 105 structurally differs from the component mounting apparatus 104 in including a flux supply unit 130 using the squeegee, but is similar to the component mounting apparatus 104 in the rest of the structure.

Therefore, according to the component mounting apparatus 105, it is possible to provide component mounting capable of obtaining the same effects as in the component mounting apparatus 104.

Figure 19:
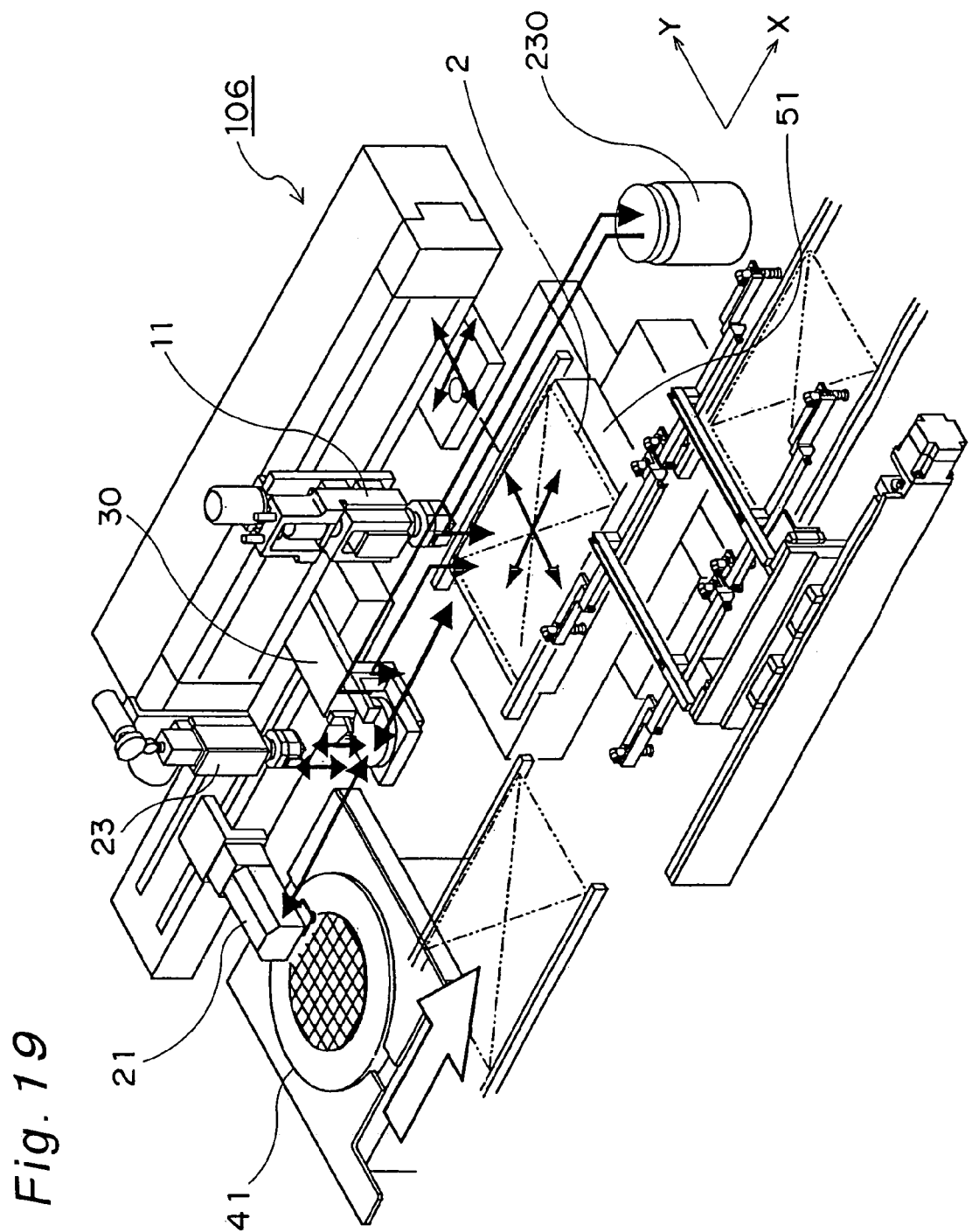
FIG. 19 is a schematic perspective view of a component mounting apparatus according to a fifth modification example of the embodiment of the present invention, showing a component mounting apparatus further including a fixed-type flux supply unit.

Next, a schematic perspective view showing the structure of a component mounting apparatus 106 according to a fifth modification example of the component mounting apparatus of this embodiment is shown in FIG. 19.

As shown in FIG. 19, the component mounting apparatus 106 structurally differs from the component mounting apparatus 101 in including a fixed flux supply unit 230 in addition to the movable flux supply unit 30, but is similar to the component mounting apparatus 101 in the rest of the structure. This different portion only will be described below.

As shown in FIG. 19, the fixed flux supply unit 230 is provided on the right side of the stage 51 in the X-axis direction in the figure. The fixed flux supply unit 230 has the same structure as the flux supply unit 530 included in the conventional component mounting apparatus 501.

The flux supply unit 30, after the transfer of the component 3, moves the component 3 from unshown transfer position P to extraction position Q while performing flux supply in parallel. Therefore, in the case where, for example, the component 3 requires high-accuracy flux supply (e.g., of high accuracy demand for the formation thickness of the flux layer), it could occur that the state of flux supply to the component 3 is affected by slight vibrations or swings or the like due to the move. As a countermeasure for such cases, the fixed flux supply unit 230 is provided so that such a component 3, while sucked and held by the mounting head section 11, is moved to above the fixed flux supply unit 230 so as to allow the flux supply to be fulfilled. On the other hand, the components 3 other than such a component as described above can be supplied with flux by using the movable flux supply unit 30.

Therefore, according to the component mounting apparatus 106 as shown above, using the movable and fixed two-type flux supply units 30 and 230 switchably depending on the type of the components 3 makes it possible to achieve the mounting of various types of components 3 onto the board 2, and moreover to fulfill efficient, higher-speed component mounting.

Figure 20:
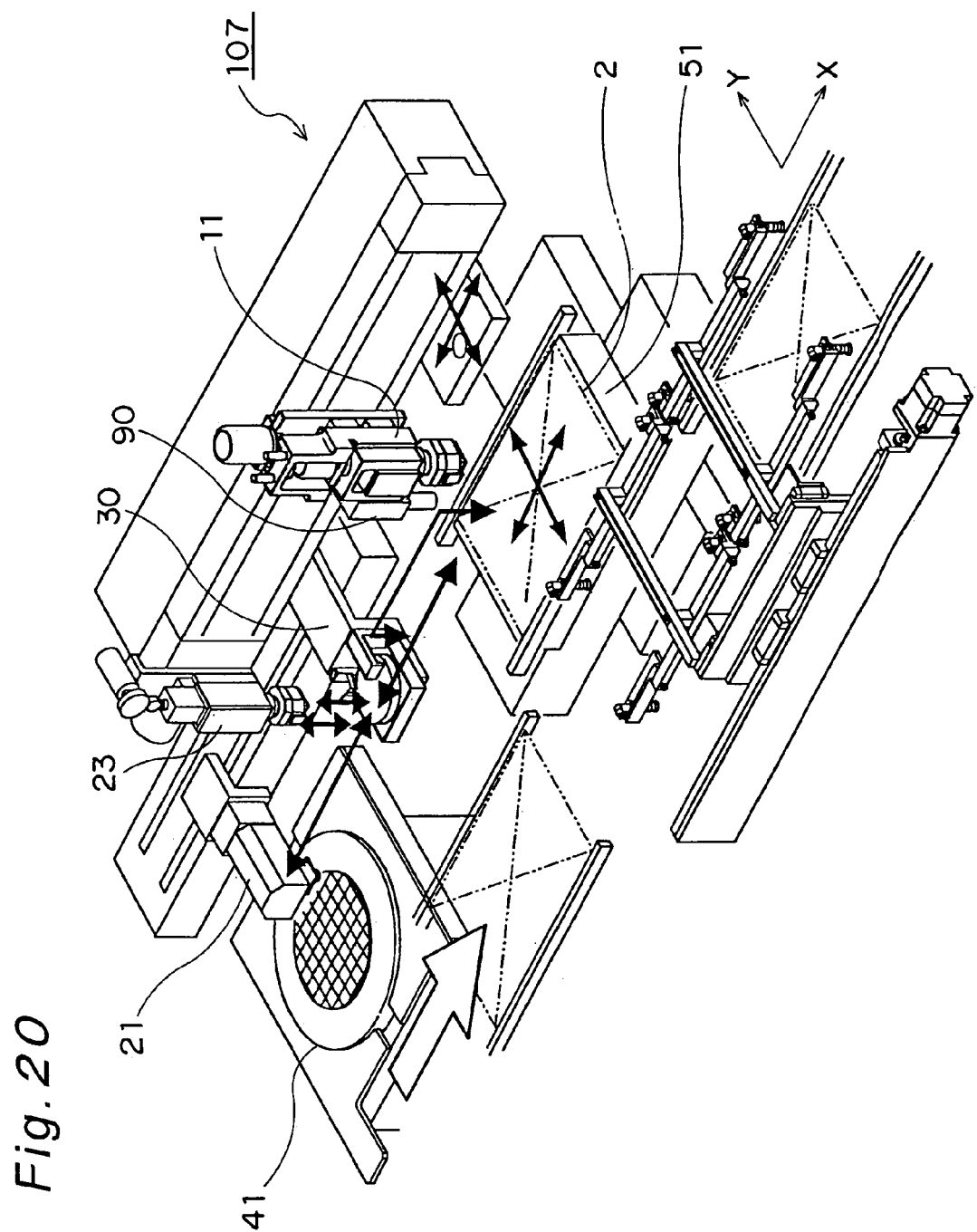
FIG. 20 is a schematic perspective view of a component mounting apparatus according to a sixth modification example of the embodiment of the present invention, showing a component mounting apparatus including a laser-displacement film thickness measuring section.

Next, a schematic perspective view showing the structure of a component mounting apparatus 107 according to a sixth modification example of the component mounting apparatus of this embodiment is shown in FIG. 20.

As shown in FIG. 20, the component mounting apparatus 107 structurally differs from the component mounting apparatus 101 in including a laser-displacement film thickness measuring section 90 for measuring the film thickness of the flux layer in the flux supply unit 30 by means of a laser, but is similar to the component mounting apparatus 101 in the rest of the structure. This different portion only will be described below.

The component mounting apparatus 107 is so structured that the flux supply unit 30 can be moved between unshown transfer position P and extraction position Q, and that flux supply to the set component 3 is performed during the move. Further, since the flux supply to the component 3 is implemented by contact of the individual bump electrode portions 3b with the flux layer, it is important to maintain and control the formation thickness of the flux layer, i.e., a uniform-thickness-layer.

Therefore, as shown in FIG. 20, the component mounting apparatus 107 has, on a side face of the mounting head section 11, the laser-displacement film thickness measuring section 90 which applies laser light to the flux layer of the flux supply unit 30 from above to recognize a displacement state of reflected laser light and which can thus recognize the displacement state of the film thickness of the flux layer. As a result of this, for example, while the laser-displacement film thickness measuring section 90 is positioned above the flux supply unit 30 positioned at the unshown extraction position Q, the state of the flux layer is recognized and, based on the recognition result, the uniform-thickness-layer formation process or the like can be carried out in the flux supply unit 30. Further, in a case where the flux layer is in such a state as cannot be managed by the aforementioned uniform-thickness-layer formation process, it is also possible, for example, to output a signal representing a flux layer abnormality or the like to the mounting control unit or the like so as to allow the operator to recognize a component mounting error.

Figure 25:
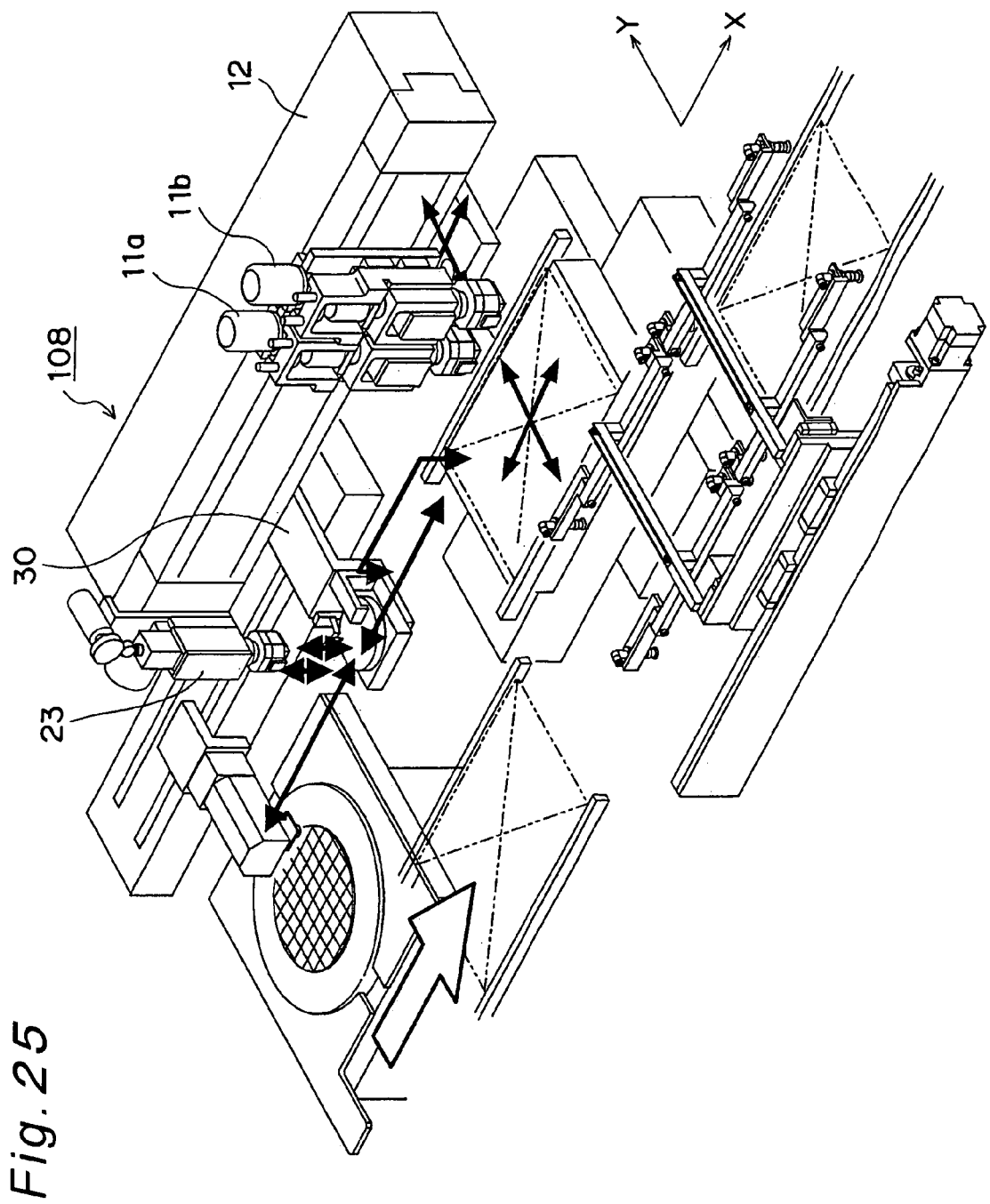
FIG. 25 is a schematic perspective view of a component mounting apparatus according to a seventh modification example of the embodiment of the present invention, showing a component mounting apparatus including two mounting head sections.

Next, a schematic perspective view showing the structure of a component mounting apparatus 108 according to a seventh modification example of the component mounting apparatus of this embodiment is shown in FIG. 25.

As shown in FIG. 25, the component mounting apparatus 108 includes two mounting head sections 11a, 11b, which are integrally movable in adjacency to each other. As a result of this, for example, by making two components 3 placed in the flux supply unit 30 and supplied with flux and then extracting the individual components 3 by the mounting head sections 11a, 11b, respectively, and further by integrally moving the mounting head sections 11a, 11b, the mounting of the components 3 onto the board 2 can be fulfilled.

Figure 26:
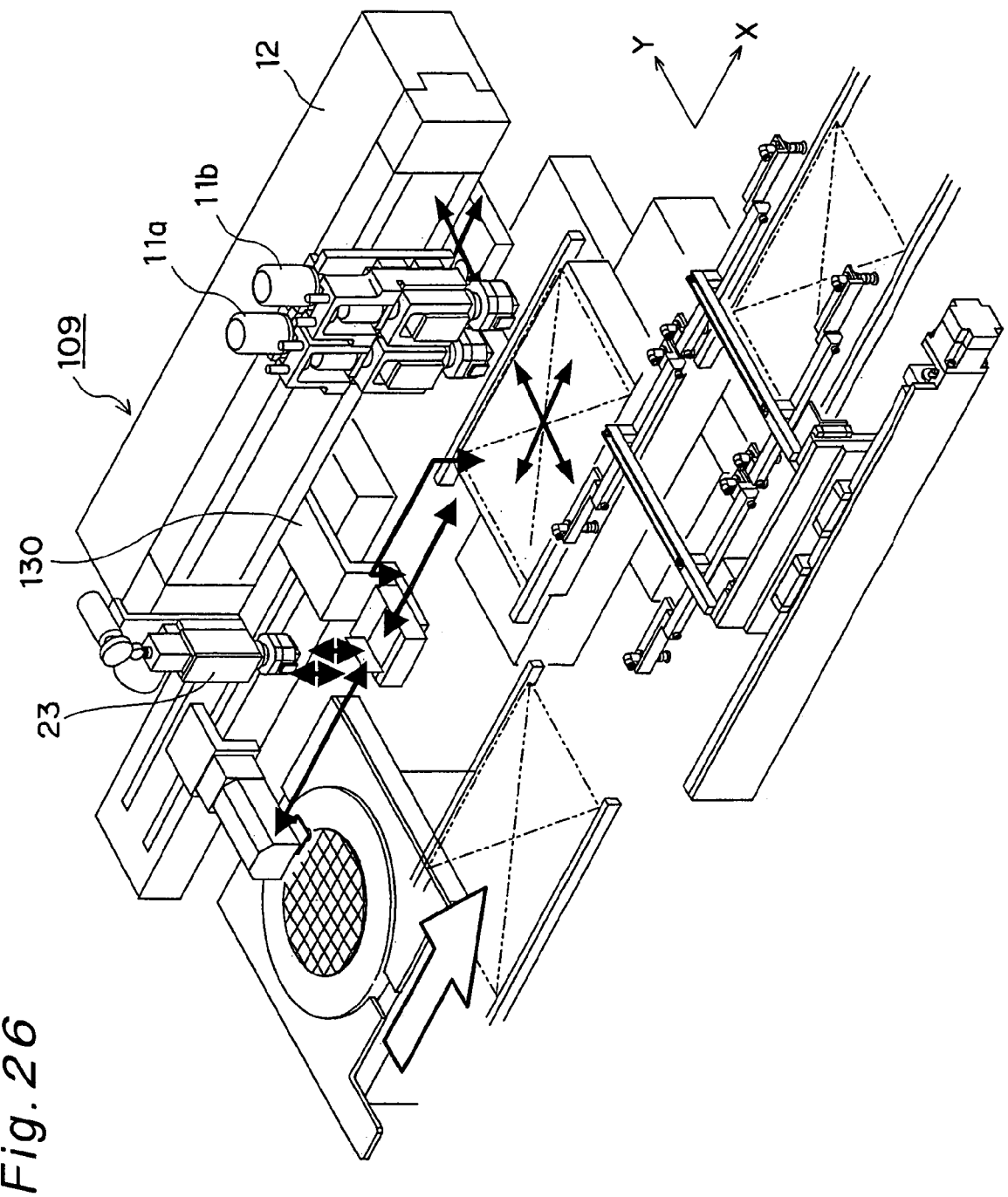
FIG. 26 is a schematic perspective view of a component mounting apparatus according to an eighth modification example of the embodiment of the present invention, showing a component mounting apparatus including two mounting head sections and a squeegee-type flux supply unit.

Also, as shown in FIG. 26, which is a schematic perspective view of a component mounting apparatus 109 according to an eighth modification example of the component mounting apparatus of this embodiment, it is also possible that the component mounting apparatus 109 includes a squeegee-type flux supply unit 130 while including the two mounting head sections 11a, 11b of the component mounting apparatus 108.

According to the above embodiment, by virtue of the arrangement that the transfer head section 23 for transferring the component 3 fed from the component feed unit 40 to the flux containing section 31 of the flux supply unit 30, and the mounting head section 11 for extracting the component 3, which has been placed in the flux containing section 31 and supplied with flux, from the flux containing section 31, are provided separately from each other in the component mounting apparatus 101, it is practicable to perform the mounting operation of the component 3 to the flux containing section 31 for flux supply, and the extraction and subsequent mounting operation of the flux-supplied component 3 from the flux containing section 31 and onto the board 2, in parallel to each other. Therefore, the effect of the time required for flux supply on the time required for component mounting can be reduced, so that the time required for component mounting can be shortened. Thus, it becomes practicable to fulfill efficient, higher-speed component mounting.

Also, by virtue of the arrangement that the containing-section moving unit 32 for reciprocatively moving the flux containing section 31 between the transfer position P and the extraction position Q is provided in the flux supply unit 30, flux supply to the set component 3 is performed during the process of the move from the transfer position P to the extraction position Q, while the component 3 is moved along with the flux containing section 31 to a neighborhood of the board 2 held on the stage 51, thus making it possible to shorten the move distance of the mounting head section 11 for the extraction of the component 3 at the extraction position Q. For instance, referring to FIG. 3, as compared with a case where the distance between the transfer position P and the component mounting region R is 595 mm and where the mounting head section 11 goes to the transfer position P to extract the component 3, in a case where the distance between the transfer position P and the extraction position Q is 375 mm and where the mounting head section 11 goes to the transfer position P to extract the component 3, the move length of the mounting head section 11 can be shortened by as much as 375 mm, so that the time required for component mounting can be shortened.

Further, in flux supply which is performed by placing the component 3 in the flux containing section 31 and bringing the individual bump electrode portions 3b and the flux layer into contact with each other, the contact needs to be securely held for a specified time in order to fulfill stable flux supply to the individual bump electrode portions 3b, whereas this specified time can be utilized for the move of the component 3 to the neighborhood of the board 2. Accordingly, the time required for component mounting can be further shortened, so that efficient, higher-speed component mounting can be fulfilled.

Further, by the above-shown structure of the component mounting apparatus 101, as shown in FIG. 4, before the completion of the mounting operation of the first component 3-1 to the board 2 (i.e., before the time T15), flux supply can be started with the next second component 3-2 transferred to the flux containing section 31. Therefore, in the case where a plurality of components 3 are continuously mounted, the mounting operation of the component 3 onto the board 2 and the flux supply operation for the next component 3 can be carried out concurrently (in parallel), so that efficient component mounting can be fulfilled.

Further, as shown in FIG. 4, before the completion of the flux supply operation to the first component 3-1 (i.e., before the time T10), the extraction operation of the second component 3-2 from the component feed unit 40 by the inversion head section 21 can be carried out. Therefore, the flux supply operation to the component 3 and the extraction operation of the next component 3 can be carried out concurrently (in parallel), so that efficient component mounting can be fulfilled in the continuous mounting of a plurality of components 3.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting method in which a plurality of bump electrode portions formed on mounting-side surfaces of components to be mounted onto a board are brought into contact with a bonding-assistant agent, which is contained in a bonding-assistant agent containing section and serves as an assistant for bonding between the bump electrode portions and the board by heating in a contact state thereof, so that the bonding-assistant agent is supplied to individual bump electrode portions, and then the components are bonded and mounted to the board via the bump electrode portions supplied with the bonding-assistant agent, the method comprising:

placing a first component, of the plurality of components, in the bonding-assistant agent containing section at a transfer position where the component is to be transferred to the bonding-assistant agent containing section;

while moving the bonding-assistant agent containing section, in which the first component is placed, from the transfer position to an extraction position where the component is to be extracted for the mounting, supplying the bonding-assistant agent to the first component through contact of the individual bump electrode portions with the bonding-assistant agent during the moving process;

extracting the first component from the bonding-assistant agent containing section at the extraction position for mounting the extracted first component on the board;

thereafter moving the bonding-assistant agent containing section from the extraction position to the transfer position and placing a second component of the plurality of components in the bonding-assistant agent containing section at the transfer position; and wherein the bonding-assistant agent is supplied to an individual component by reciprocating the bonding-assistant agent containing section between the transfer position and the extraction position.

2. The component mounting method as defined in claim 1, wherein the supply of the bonding-assistant agent to the second component by placing the component in the bonding-assistant agent containing section is started before completion of the mounting of the first component, which is supplied with the bonding-assistant agent, onto the board.

3. The component mounting method as defined in claim 2, wherein the supply of the bonding-assistant agent to the individual component is completed at a time when the bonding-assistant agent containing section, in which the component is placed, has reached the extraction position.

4. The component mounting method as defined in claim 3, further comprising:

holding and extracting the first component from a component feed unit in which the plurality of components are extractably placed, and then transferring the first component to the bonding-assistant agent containing section; and starting the holding and extracting of the second component from the component feed unit, before completion of the supply of the bonding-assistant agent to the first component.

* * * * *